(12) United States Patent
Yamamichi et al.

(10) Patent No.: US 10,098,179 B2
(45) Date of Patent: Oct. 9, 2018

(54) ELECTRONIC DEVICE

(71) Applicant: Renesas Electronics Corporation, Kawasaki-shi, Kanagawa (JP)

(72) Inventors: Shintaro Yamamichi, Kanagawa (JP); Hirokazu Honda, Kanagawa (JP); Masaki Watanabe, Kanagawa (JP); Junichi Arita, Kanagawa (JP); Norio Okada, Kanagawa (JP); Jun Ueno, Kanagawa (JP); Masashi Nishimoto, Kanagawa (JP); Michitaka Kimura, Kanagawa (JP); Tomohiro Nishiyama, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 78 days.

(21) Appl. No.: 14/258,246

(22) Filed: Apr. 22, 2014

(65) Prior Publication Data

US 2014/0329476 A1    Nov. 6, 2014

(30) Foreign Application Priority Data

May 2, 2013 (JP) ................................ 2013-097021

(51) Int. Cl.
*H04B 1/38*        (2015.01)
*H04B 1/40*        (2015.01)
*H04W 84/18*     (2009.01)

(52) U.S. Cl.
CPC ... *H04W 84/18* (2013.01); *H01L 2224/45144* (2013.01); *H01L 2224/48091* (2013.01); *H01L 2224/49111* (2013.01)

(58) Field of Classification Search
USPC ....... 343/700, 741, 767, 793, 818, 876, 895; 257/676, 686, 724
See application file for complete search history.

(56) References Cited

U.S. PATENT DOCUMENTS

| | | | |
|---|---|---|---|
| 7,095,372 B2 | 8/2006 | Soler Castany et al. | |
| 7,579,691 B2 * | 8/2009 | Sukegawa | H01L 23/48 257/723 |
| 7,791,539 B2 * | 9/2010 | Soler Castany | H01Q 1/2283 343/700 MS |
| 8,148,806 B2 * | 4/2012 | Lin | H01L 25/0657 257/202 |

(Continued)

FOREIGN PATENT DOCUMENTS

| | | | | |
|---|---|---|---|---|
| CN | 1723587 A | 1/2006 | | |
| JP | 2001284119 | * 10/2001 | ............... | G06F 1/16 |

(Continued)

OTHER PUBLICATIONS

Communication dated Sep. 5, 2017 from the State Intellectual Property Office of the P.R.C. in counterpart application No. 201410184296.7.

*Primary Examiner* — Edward Urban
*Assistant Examiner* — Ralph H Justus
(74) *Attorney, Agent, or Firm* — Sughrue Mion, PLLC

(57) ABSTRACT

A compact electronic device as a constituent element of a wireless communication system using a sensor. A first feature of the device is that a first semiconductor chip is bare-chip-mounted over a front surface of a first wiring board in the form of a chip and a second semiconductor chip is bare-chip-mounted over a second wiring board in the form of a chip. A second feature is that a wireless communication unit and a data processing unit which configure a module are separately mounted. A third feature is that the first and second wiring boards are stacked in the board thickness direction to make up the module (electronic device).

23 Claims, 20 Drawing Sheets

(56) References Cited

U.S. PATENT DOCUMENTS

| | | | |
|---|---|---|---|
| 8,378,470 B2* | 2/2013 | Nakashiba | H01L 23/48 257/530 |
| 8,963,310 B2* | 2/2015 | Desai | H01L 23/3128 257/666 |
| 2005/0156207 A1 | 7/2005 | Yazawa et al. | |
| 2005/0288392 A1 | 12/2005 | Okubora | |
| 2006/0214297 A1* | 9/2006 | Moriyama | H01L 21/4867 257/752 |
| 2007/0096160 A1* | 5/2007 | Beroz | H01F 17/0033 257/232 |
| 2008/0283287 A1* | 11/2008 | Takahashi | H05K 3/4602 174/264 |
| 2008/0311862 A1* | 12/2008 | Spina | H01Q 1/38 455/78 |
| 2009/0284415 A1* | 11/2009 | Worl | H01Q 21/061 342/372 |
| 2011/0163919 A1 | 7/2011 | Suzuki | |
| 2011/0193203 A1* | 8/2011 | Goto | H01L 23/5389 257/659 |
| 2014/0239077 A1* | 8/2014 | Ikeda | G06K 19/07749 235/492 |

FOREIGN PATENT DOCUMENTS

| | | | | |
|---|---|---|---|---|
| JP | 2001285119 | * | 10/2001 | G06F 1/16 |
| JP | 2005-207797 A | | 8/2005 | |
| JP | 2006-505973 A | | 2/2006 | |
| JP | 2007-313594 A | | 12/2007 | |
| JP | 2011245234 | * | 11/2011 | G06K 19/007745 |
| WO | 2010/026990 A1 | | 3/2010 | |

* cited by examiner

ELECTRONIC DEVICE

CROSS-REFERENCE TO RELATED APPLICATIONS

The disclosure of Japanese Patent Application No. 2013-097021 filed on May 2, 2013 including the specification, drawings and abstract is incorporated herein by reference in its entirety.

BACKGROUND

The present invention relates to an electronic device and more particularly to technology useful for an electronic device as a constituent element of a wireless communication system.

Japanese Unexamined Patent Application Publication No. 2007-313594 describes a structure in which a sensor control layer and an RF layer are arranged so that a surface on which a sensor control portion is formed and a surface on which an RF portion is formed are in contact with an MEMS layer, and the MEMS layer is sandwiched between these layers.

Japanese Unexamined Patent Application Publication (Translation of PCT Application) No. 2006-505973 describes a technique that an antenna area is located over a substrate and a die includes an RF terminal.

WO 2010/026990 describes a technique that a transmitting circuit package and a receiving circuit package as high-frequency circuit packages are mounted over an antenna substrate.

Japanese Unexamined Patent Application Publication No. 2005-207797 describes a technique that an RF interface block for converting a processed sensing signal into a high-frequency signal is provided.

SUMMARY

For example, there is a demand for a compact electronic device which functions as a node in a wireless communication system. Existing electronic devices which function as nodes in a wireless sensor network (WSN), a kind of sensor-based wireless communication system, are small so that a person carrying it does "not feel uncomfortable" but there is a demand for a product which is small to the extent that a person carrying it becomes "unconscious of it".

The above and further objects and novel features of the invention will more fully appear from the following detailed description in this specification and the accompanying drawings.

According to one aspect of the invention, there is provided an electronic device including a data processing unit and a wireless communication unit, in which the data processing unit includes a first semiconductor chip (bare chip) mounted over a first surface of a first wiring board in the form of a chip and the wireless communication unit includes a second semiconductor chip (bare chip) mounted over a second surface of a second wiring board in the form of a chip. The first wiring board and the second wiring board are electrically coupled and an external coupling terminal for electrical coupling with an external device is provided on the first wiring board.

According to the invention, the electronic device can be compact.

DETAILED DESCRIPTION

Figure 1:
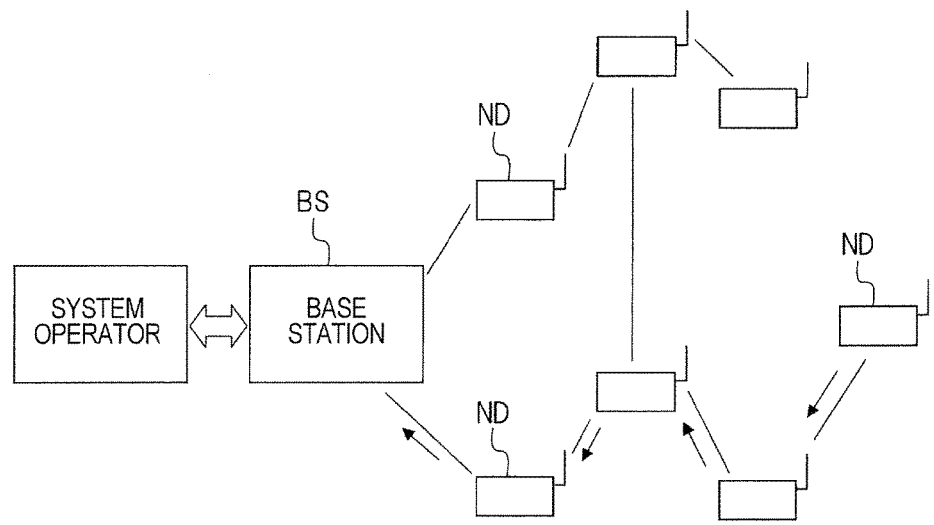
FIG. 1 is a schematic view showing an example of the general configuration of an application which uses a wireless sensor network.

The preferred embodiments will be described below in different sections or separately as necessary, but such descriptions are not irrelevant to each other unless otherwise specified. One description may be, in whole or in part, a modified, detailed or supplementary form of another.

Also, regarding the preferred embodiments described below, when a specific number (the number of pieces, numerical value, quantity, range, etc.) is indicated for an element, it is not limited to the specific number unless otherwise specified or theoretically limited to that number; it may be larger or smaller than the specific number.

In the preferred embodiments described below, constituent elements (including constituent steps) are not necessarily essential unless otherwise specified or theoretically essential.

Similarly, in the preferred embodiments described below, when a specific form or positional relation is indicated for an element, it should be interpreted to include a form or positional relation which is virtually equivalent or similar to the specific form or positional relation unless otherwise specified or theoretically limited to the specific form or positional relation. The same can be said of the abovementioned numerical data and range.

In all the drawings that illustrate the preferred embodiments, elements with like functions are designated by like reference numerals and repeated descriptions thereof are omitted. Hatching may be used even in a plan view for easy understanding.

First Embodiment
<Wireless Sensor Network>

The first embodiment described below concerns a wireless sensor network as an example of a wireless communication system but the technical idea of the first embodiment can be applied not only thereto but also to a wide variety of sensor-based wireless communication systems.

In recent years, wireless sensor networks as sensor-based wireless communication systems have been attracting strong attention and are expected to be used in a wide range of application fields. For example, a node (terminal) which configures a wireless sensor network is designed to receive data from a sensor such as temperature, illuminance, and acceleration and transmit the received data by radio waves. In a wireless sensor network, for example, "multi-hop ad hoc communication" is used in which data received by a node is transferred between nodes in a bucket-brigade manner.

In existing mobile communications, an infrastructure including base stations and a fixed network coupling them must be constructed. On the other hand, in a wireless sensor network which uses "multi-hop ad hoc communications", each node can make communications on its own by autonomous routing. Therefore, the wireless sensor network does not need a fixed network and offers an advantage that a network can be immediately constructed simply by placing nodes in a desired environment.

Thus, an autonomous wireless sensor network can be established simply by arranging nodes, offering an advantage that field installation work can be reduced. Also, since a dynamic state of the real world can be captured by acquiring data from a sensor in the wireless sensor network, tracking of an object and monitoring of a natural environment are promising application fields of wireless sensor networking.

FIG. 1 is a schematic view showing an example of the general configuration of an application which uses a wireless sensor network. Referring to FIG. 1, in the wireless sensor network, a plurality of nodes ND are arranged and each node is designed to use a sensor function to observe the ambient environment. The environment data observed at each node ND is collected into abase station BS through multi-hop ad hoc communication between nodes ND.

The base station BS is a computer which can access the wireless sensor network and collects and holds, for example, environment data received from the wireless sensor network. For example, the computer of a system operator wishing to get environment data from the wireless sensor network can access the base station BS to acquire required data and analyze the acquired data to grasp the actual environmental condition and perform the processing task required by its application based on the analysis result.

<Configuration of the Node>

Figure 2:
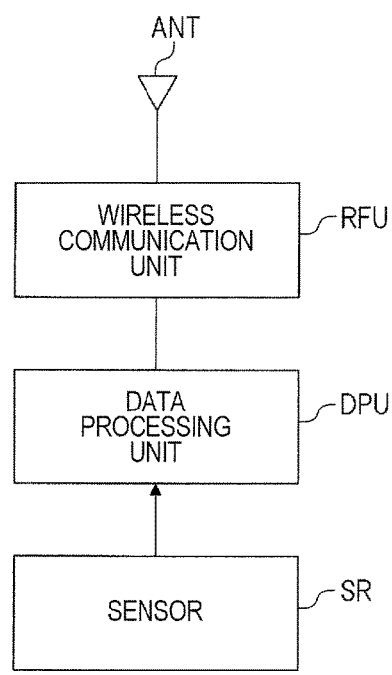
FIG. 2 is a block diagram showing the configuration of a node.

Next, anode which configures the wireless sensor network will be described. FIG. 2 is a block diagram showing the configuration of the node. As shown in FIG. 2, the node, as a constituent element of the wireless sensor network, includes, for example, a sensor SR, a data processing unit DPU, a wireless communication unit RFU, and an antenna ANT.

The sensor SR includes elements and devices which detect physical values of temperature, pressure, flow rate, light, magnetism and the like and change in their values and is designed to convert the detected value into an adequate signal and output the signal. For example, the sensor SR may be a temperature sensor, pressure sensor, flow sensor, optical sensor, magnetic sensor, illuminance sensor, acceleration sensor, angular velocity sensor, or image sensor.

The data processing unit DPU processes a signal from the sensor SR and outputs the processed data. The wireless communication unit RFU converts the data processed by the data processing unit DPU into a radio-frequency signal and transmits it through the antenna ANT. In addition, the wireless communication unit RFU receives a radio-frequency signal through the antenna ANT.

In the node thus configured, when the sensor SR detects a physical value, it outputs a signal and the output signal enters the data processing unit DPU. Then, in the data processing unit DPU, the received signal is processed and the processed data is sent to the wireless communication unit RFU. Then, in the wireless communication unit RFU, the received data is converted into a radio-frequency signal and the radio-frequency signal is transmitted through the antenna ANT. In this way, a signal with a radio frequency which corresponds to the physical value detected by the sensor SR is transmitted from the node.

<Detailed Configuration of the Node>

Figure 3:
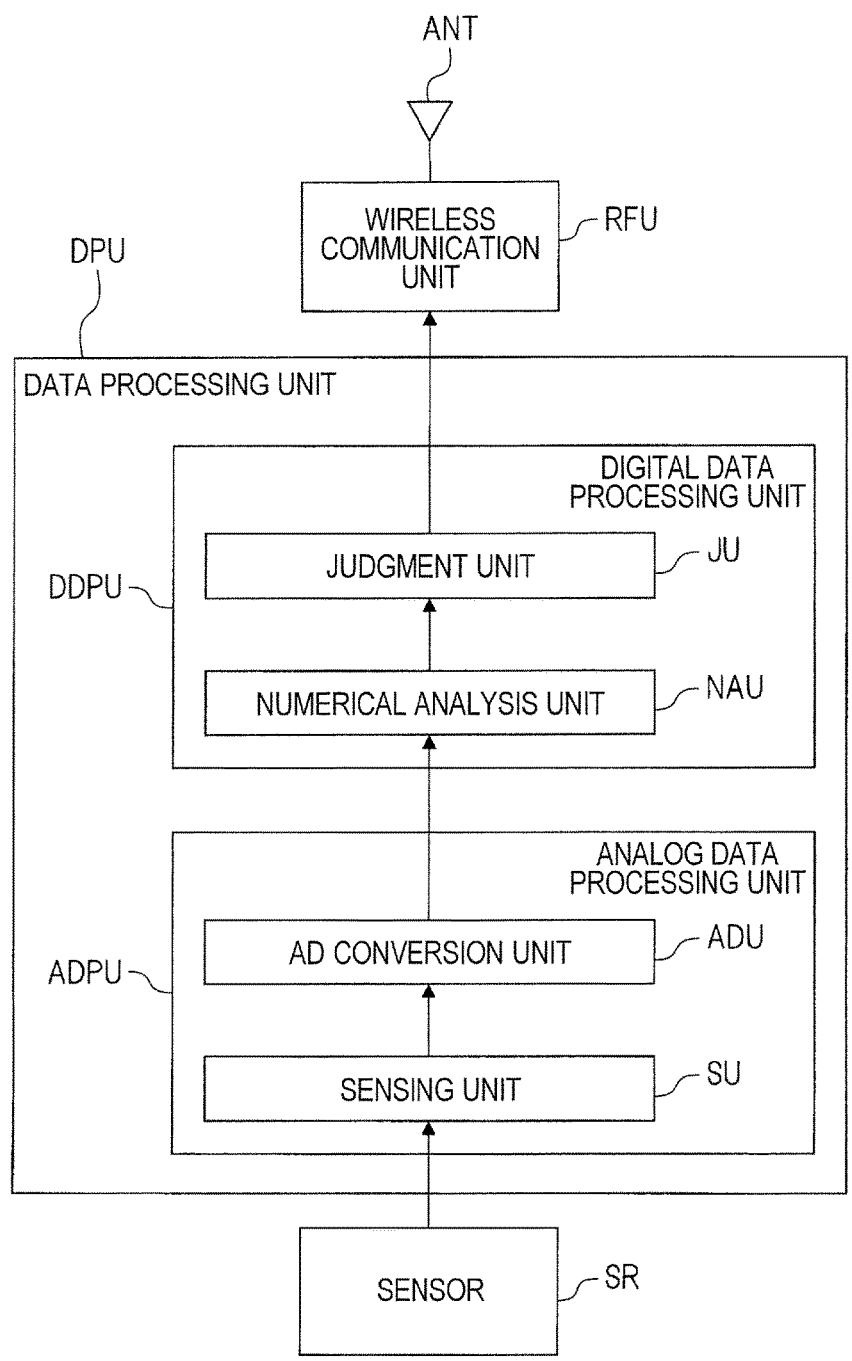
FIG. 3 is a block diagram showing an example of the detailed configuration of the data processing unit of the node.

Next, an example of the detailed configuration of the node will be described. FIG. 3 is a block diagram showing the detailed configuration of the data processing unit DPU. As shown in FIG. 3, the data processing unit DPU of the node includes an analog data processing unit ADPU and a digital data processing unit DDPU. The analog data processing unit ADPU includes a sensing unit SU and an AD conversion unit ADU and the digital data processing unit DDPU includes a numerical analysis unit NAU and a judgment unit JU.

First, the analog data processing unit ADPU will be described. The analog data processing unit ADPU receives an analog signal from the sensor SR and converts the analog signal into data which is easy to handle. The analog data processing unit ADPU includes a sensing unit SU and an AD conversion unit ADU.

The sensing unit SU includes, for example, an amplifier circuit, a transimpedance circuit, and a filter circuit. A signal from the sensor SR is a minute signal and its signal format is often not suitable to be processed by the digital data processing unit DDPU. Therefore, a circuit is needed to amplify the minute analog signal from the sensor SR into a large analog signal suitable for input to the digital data processing unit DDPU. Also, in some cases, a signal from the sensor SR is not a voltage signal but a current signal. In that case, the AD conversion circuit, which converts an analog signal into a digital signal, can only receive a voltage signal. Therefore, a circuit is needed to convert a current signal into a voltage signal and amplify it into a sufficiently large voltage signal. This circuit, called the transimpedance circuit, is an analog circuit which serves as both a conversion circuit and an amplifier circuit. Furthermore, the output signal from the sensor SR may have an unwanted frequency signal (noise). If so, it would be hard to receive the output signal from the sensor SR. For this reason, if the noise has a higher frequency than the output signal, the noise must be removed by a low-pass filter circuit. On the other hand, if the noise has a lower frequency than the output signal, the noise must be removed by a high-pass filter circuit.

Thus, the reason that the analog data processing unit ADPU has the above sensing unit SU including the amplifier circuit, transimpedance circuit and filter circuit is that it is difficult to handle the output signal from the sensor SR directly as mentioned above. The series of analog circuits which configure the sensing unit is also called the "analog front end (AFE)".

Next, the AD conversion unit ADU converts analog data sent from the sensing unit SU into digital data. In other words, since the digital data processing unit DDPU can only handle digital data, this analog data must be converted into digital data by the AD conversion unit ADU.

Then, the digital data processing unit DDPU receives the digital data from the analog data processing unit ADPU and processes the digital data. It includes, for example, a numerical analysis unit NAU and a judgment unit JU. The digital data processing unit DDPU is, for example, an MCU (Micro Control Unit).

The numerical analysis unit NAU receives the digital data from the analog data processing unit ADPU and numerically processes the digital data according to a program. The judgment unit JU selects data to be sent to the wireless communication unit RFU based on the result of numerical processing by the numerical analysis unit NAU.

The data processing unit DPU is configured as mentioned above. Next, how it operates will be described. First, a physical value of temperature, pressure, flow rate, light, or magnetism is detected by the sensor SR and a weak analog detection signal is outputted from the sensor SR based on the detection result. Then, the output weak detection signal enters the sensing unit SU in the analog data processing unit ADPU. In the sensing unit SU, the received detection signal is amplified by the amplifier circuit. If the detection signal is not a voltage signal but a current signal, the current signal is converted into a voltage signal by the transimpedance circuit. In addition, noise in the detection signal is removed by the filter circuit. Thus, in the sensing unit SU, the detection signal (analog signal) received from the sensor SR is processed to generate analog data (analog signal) and the data is sent to the AD conversion unit ADU. The AD conversion unit ADU receives the analog data from the sensing unit SU and converts it into digital data. Then, the digital data from the AD conversion unit ADU enters the numerical analysis unit NAU in the digital data processing unit DDPU. In the numerical analysis unit NAU, numerical processing is performed on the received digital data and based on the result of numerical processing, the judgment unit JU selects the digital data to be sent to the wireless communication unit RFU. Then the digital data from the digital data processing unit DDPU enters the wireless communication unit RFU, where the signal is converted into a radio-frequency signal before being transmitted from the antenna ANT. The node transmits a signal with a radio frequency which corresponds to the physical value detected by the sensor SR in the abovementioned sequence.

Figure 4:
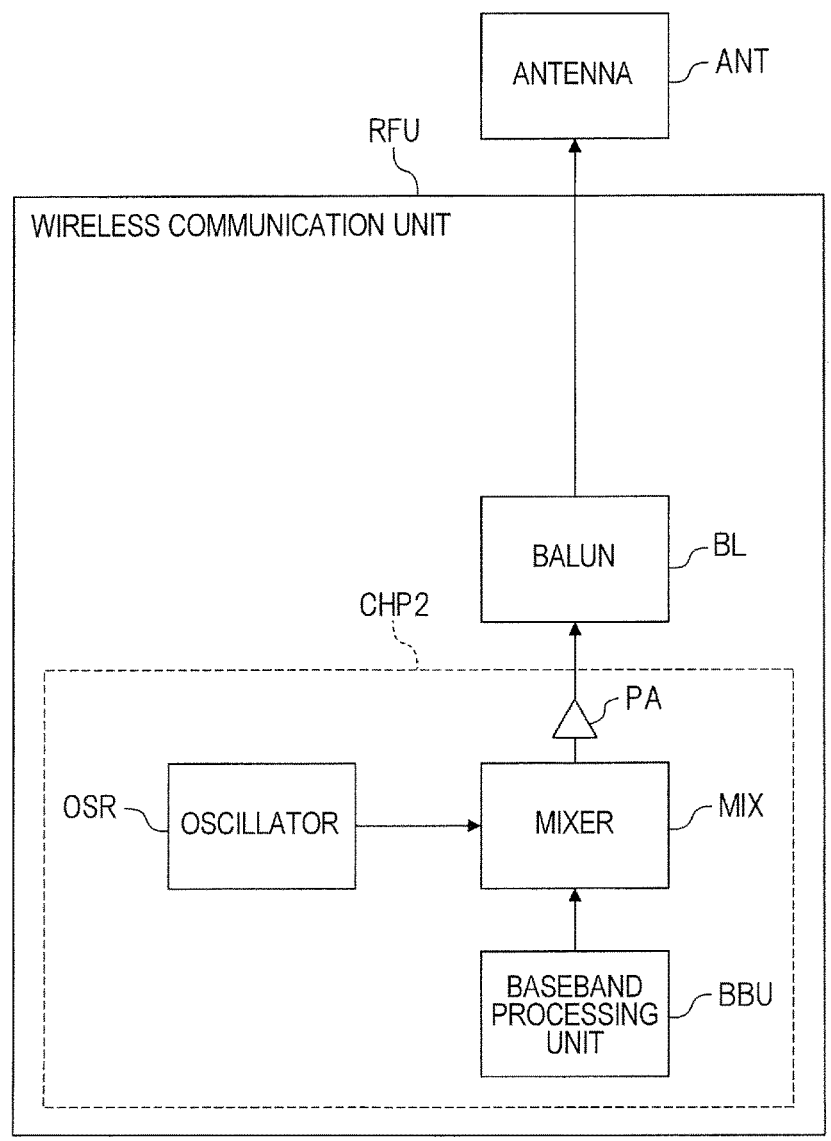
FIG. 4 is a block diagram showing an example of the detailed configuration of the transmitting section of the wireless communication unit of the node.

Next, the detailed configuration of the wireless communication unit RFU of the node will be described. FIG. 4 is a block diagram showing an example of the detailed configuration of the transmitting section of the wireless communication unit RFU of the node. Referring to FIG. 4, the wireless communication unit RFU includes a baseband processing unit BBU, a mixer MIX, an oscillator OSR, a power amplifier PA, and a balun BL.

The baseband processing unit BBU generates a baseband signal for modulation from the digital signal received from the data processing unit and processes it and the oscillator OSR generates a carrier wave with a radio frequency. The mixer MIX superimposes the baseband signal generated by the baseband processing unit BBU, on a carrier wave generated by the oscillator OSR to generate a radio-frequency signal. The power amplifier PA amplifies the radio-frequency signal sent from the mixer MIX and the balun BL is an element for conversion between balanced and unbalanced electric signals.

The transmitting section of the wireless communication unit RFU is configured as mentioned above. Next, how it operates will be described. First, in the baseband processing unit BBU, a baseband signal for modulation is generated from the digital data received from the data processing unit. Then, the baseband signal and the carrier wave generated by the oscillator OSR are mixed in the mixer MIX and thereby modulated to generate a radio-frequency signal. The radio-frequency signal is amplified by the power amplifier PA before being transmitted from the wireless communication unit RFU through the balun BL. Then, the radio-frequency signal from the wireless communication unit RFU is transmitted from the antenna. ANT electrically coupled to the wireless communication unit RFU. Thus the radio-frequency signal is transmitted from the node in the above sequence.

Figure 5:
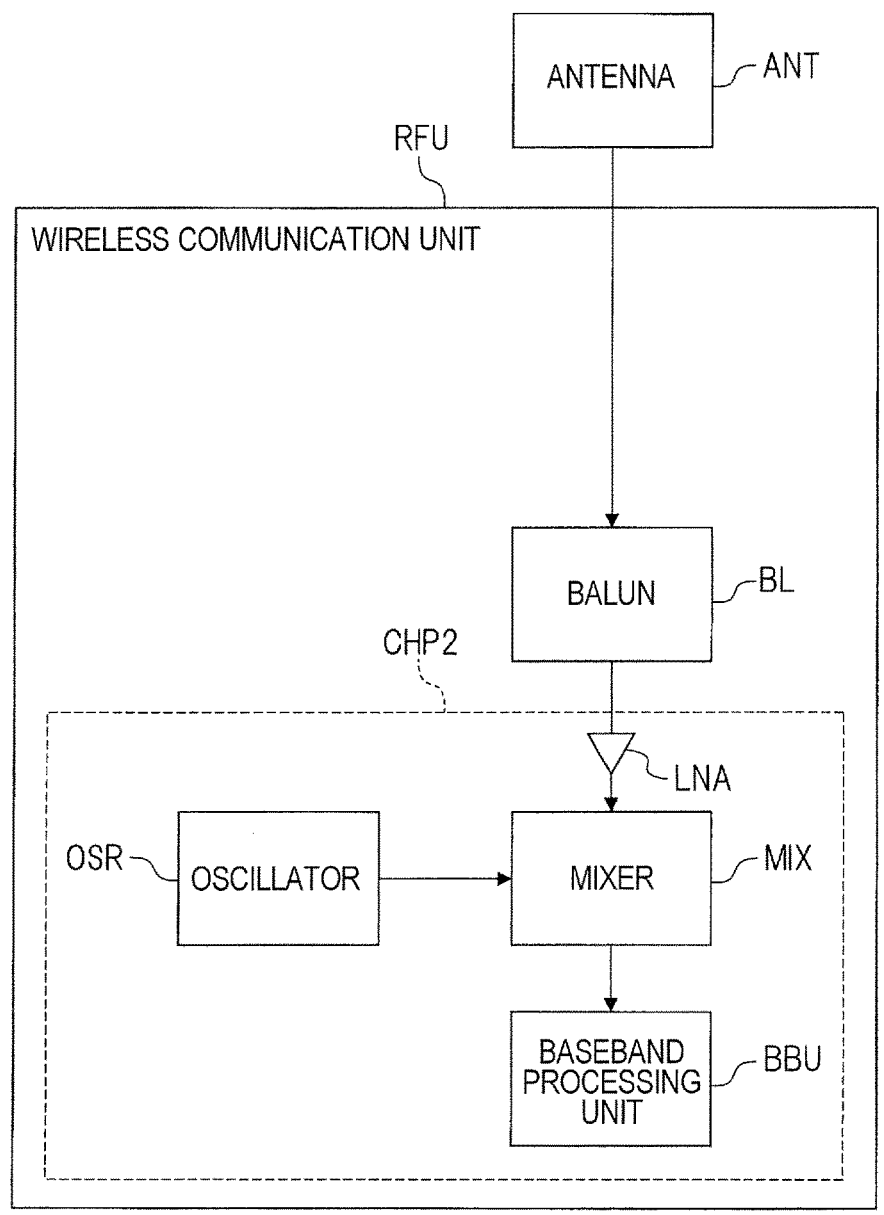
FIG. 5 is a block diagram mainly showing an example of the detailed configuration of the receiving section of the wireless communication unit of the node.

FIG. 5 is a block diagram mainly showing an example of the detailed configuration of the receiving section of the wireless communication unit RFU of the node. Referring to FIG. 5, the receiving section of the wireless communication unit RFU includes a baseband processing unit BBU, a mixer MIX, an oscillator OSR, a low-noise amplifier LNA, and a balun BL.

The balun BL is an element for conversion between balanced and unbalanced electric signals. The low-noise amplifier LNA amplifies a received weak signal. The oscillator OSR generates a carrier wave with a radio frequency and the mixer MIX superimposes the received signal amplified by the low-noise amplifier LNA, on a carrier wave generated by the oscillator OSR to generate a baseband signal. The baseband signal processing unit BBU generates digital data from the demodulated baseband signal and processes it.

The receiving section of the wireless communication unit RFU is configured as mentioned above. Next, how it operates will be described. First, a signal received by the antenna ANT is sent to the low-noise amplifier LNA through the balun BL and amplified there. After that, the amplified received signal is mixed with a carrier wave generated by the oscillator OSR in the mixer MIX and thereby demodulated to generate a baseband signal. Then, the demodulated baseband signal is converted into digital data in the baseband processing unit BBU. The node receives the signal in the above sequence.

<Techniques Related to the Node Package Structure and Points to be Improved>

Next, the techniques related to the node package structure with the above functions will be described and points to be improved in the related techniques will be explained.

For example, as a related technique concerning the node package structure, the development of a module in which an antenna, a package type semiconductor device as typified by QFP (Quad Flat Package), and a sensor are integrally mounted over a wiring board has been reported. However, in this technique, since a semiconductor chip as a package type semiconductor device is mounted over the wiring board, the module size must be relatively large. In another related technique, semiconductor device with a wireless communication section is formed integrally with a sensor, so a radio certification must be acquired according to the sensor type of each module, resulting in high module production cost.

As can be understood from the above, the modules in the related techniques have points to be improved from the viewpoints of module compactness and production cost. Therefore, the first embodiment offers a technique to address the points to be improved in the above related techniques. Next, the technical idea of the first embodiment which addresses the points to be improved will be described.

<Node Package Structure in the First Embodiment>

Figure 6:
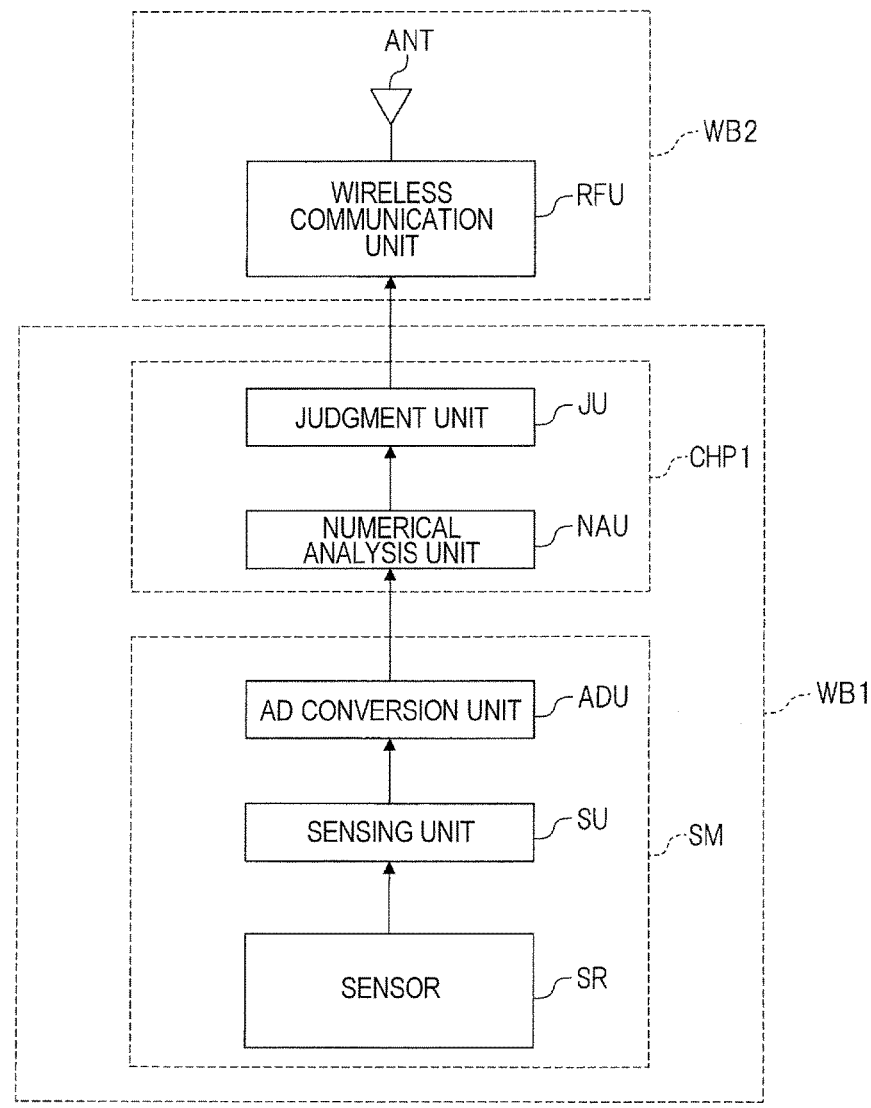
FIG. 6 shows the relation between the node functional components and the wiring boards formed with them in the first embodiment.

FIG. 6 shows the relation between the node functional components and the wiring boards formed with them in the first embodiment. Referring to FIG. 6, in the first embodiment, the sensor SR, sensing unit SU, and AD conversion unit ADU are integrated into a sensor module SM. The numerical analysis unit NAU and judgment unit JU are integrated in a semiconductor chip CHP1 which configures an MCU. The sensor module SM and semiconductor chip CHP1 are mounted over a common wiring board WB1.

On the other hand, the wireless communication unit RFU and antenna ANT are mounted over a wiring board WB2, a board other than the wiring board WB1. As shown in FIGS. 4 and 5, among the components of the wireless communication unit RFU, the baseband processing unit BBU, oscillator OSR, mixer MIX, power amplifier PA and low-noise amplifier LNA are mounted over the semiconductor chip CHP2 which configures an MCU.

Figure 7:
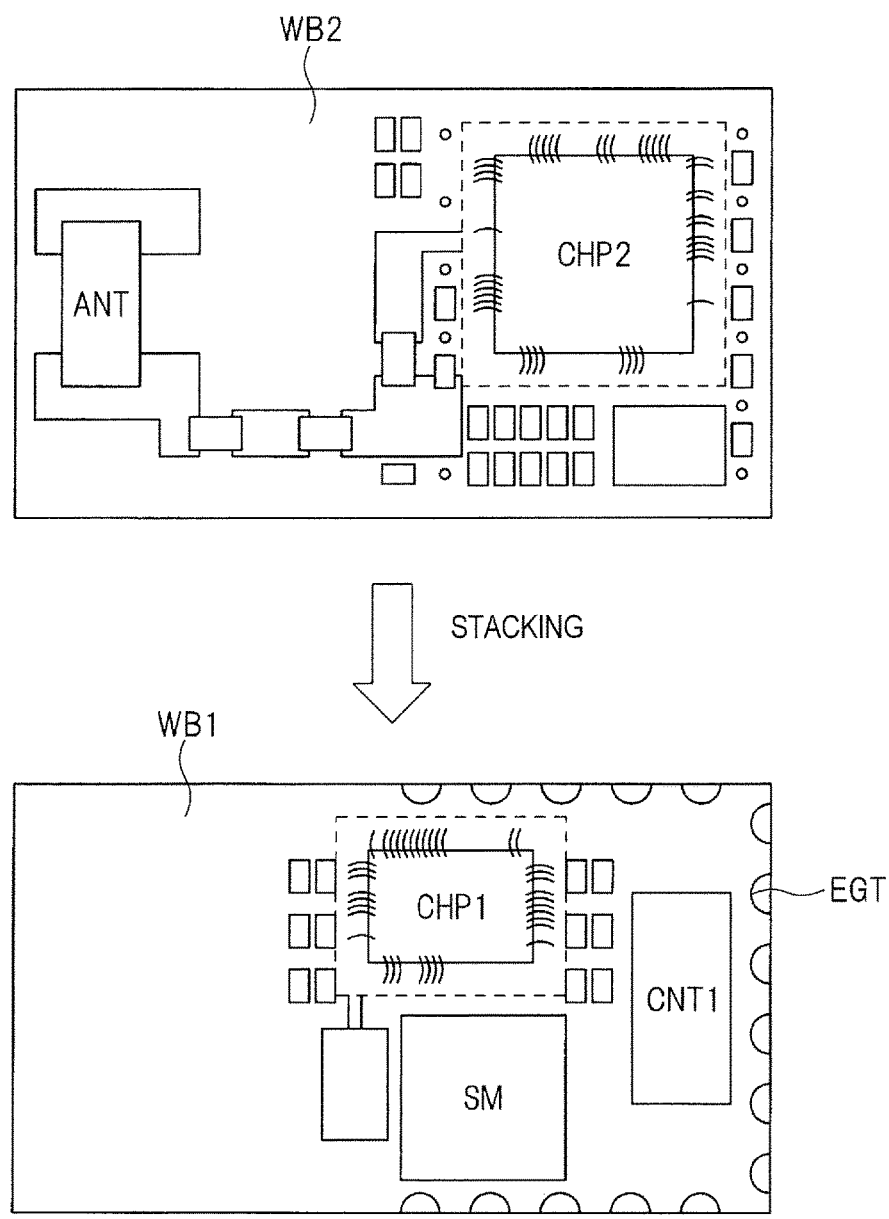
FIG. 7 shows the external structure of the module according to the first embodiment.

Next, the external structure of the module (electronic device) in the first embodiment which corresponds to the above node package structure will be described. FIG. 7 shows the external structure of the module according to the first embodiment. Referring to FIG. 7, the module according to the first embodiment includes a wiring board WB1 and a wiring board WB2, in which the wiring board WB2 lies over the wiring board WB1.

The sensor module SM, semiconductor chip CHP1, and connector CNT1 are mounted over the wiring board WB1 and edge terminals EGT which function as external coupling terminals are formed on the side faces of the wiring board WB1. In the first embodiment, the semiconductor chip CHP1 is mounted over the front surface of the wiring board WB1 in the form of a chip. In other words, in the first embodiment, the semiconductor chip CHP1 is bare-chip-mounted over the wiring board WB1. The semiconductor chip CHP1 and the wiring board WB1 are electrically coupled, for example, by wires. Specifically, pads (not shown) on the semiconductor chip CHP1 are electrically coupled with terminals (not shown) on the wiring board WB1, for example, by gold wires. In order to protect the wires, the surface of the semiconductor chip CHP1 including the wires is covered by potting resin.

On the other hand, a semiconductor chip CHP2 and an antenna ANT are mounted over the wiring board WB2 which is other than the wiring board WB1. The semiconductor chip CHP2 and the antenna ANT are arranged so that the distance between them is as large as possible. For example, as shown in FIG. 7, the semiconductor chip CHP2 is located in a first region as a right region of the wiring board WB2 and the antenna ANT is located in a second region as a left region of the wiring board WB2. The semiconductor chip CHP2 is mounted over the front surface of the wiring board WB2 in the form of a chip. In other words, in the first embodiment, the semiconductor chip CHP2 is bare-chip-mounted over the wiring board WB2. The semiconductor chip CHP2 and the wiring board WB2 are electrically coupled, for example, by wires. Specifically, pads (not shown) on the semiconductor chip CHP2 are electrically coupled with terminals (not shown) on the wiring board WB2, for example, by gold wires. In order to protect the wires, the surface of the semiconductor chip including the wires is covered by potting resin. Although not shown in FIG. 7, a connector is located on the back surface of the wiring board WB2 and by coupling the connector on the back surface of the wiring board WB2 with the connector CNT1 on the front surface of the wiring board WB1, the wiring board WB1 and wiring board WB2 are electrically coupled. In the module according to the first embodiment, the wiring board WB2 lies over the wiring board WB1. Another semiconductor chip in the form of a chip (bare chip) and surface-mount components may be mounted over the wiring board WB2.

<Features of the First Embodiment>

The module according to the first embodiment is configured as mentioned above and its features will be described below.

A first feature of the first embodiment is that as shown in FIG. 7, for example, the semiconductor chip CHP1 in the form of a chip is bare-chip-mounted over the front surface of the wiring board WB1 and the semiconductor chip CHP2 in the form of a chip is bare-chip-mounted over the front surface of the wiring board WB2. Consequently, according to the first embodiment, the areas occupied by the semiconductor chip CHP1 and semiconductor chip CHP2 can be reduced and thus the sizes of the semiconductor chip CHP1 and semiconductor chip CHP2 can be smaller. Therefore, according to the first embodiment, the size of the module including the wiring board WB1 and wiring board WB2 can be smaller. In other words, according to the first embodiment, the size of the module as an electronic device can be reduced by using bare chip mounting technology.

The reason is explained below. For example, let's assume that a package semiconductor device is mounted over the front surface of a wiring board as in the above related techniques. In that case, for example, the semiconductor chip is mounted over a chip mounting region called a tab and coupled by plural leads and wires arranged around the tab. The semiconductor chip, wires and leads are partially sealed with a resin sealing body. Consequently, the sealing body area is larger than the planar size of the semiconductor chip and the area where the package semiconductor device is mounted is larger.

Furthermore, the semiconductor chip and wiring board are coupled not directly by wires but the semiconductor chip is coupled with leads by wires and the leads are coupled with the wiring board. The presence of the leads between the semiconductor chip and wiring board results in an increased loss and a decrease in the magnitude of an output signal since the signal from the semiconductor chip passes through the leads. Consequently an additional amplifier circuit must be provided in the semiconductor chip, leading to a larger semiconductor chip size.

In other words, when a package semiconductor device is mounted over a wiring board, the wiring board size must be increased for two reasons: one reason is that the semiconductor chip size must be large enough to accommodate a circuit to compensate for attenuation of an output signal from the chip and the second reason is that the package size itself is far larger than the semiconductor chip size. For these reasons, in the related techniques, the area of the whole module must be relatively large.

By contrast, in the module according to the first embodiment, the semiconductor chip CHP1 in the form of a chip is bare-chip-mounted over the front surface of the wiring board WB1 and also the semiconductor chip CHP2 in the form of a chip is bare-chip-mounted over the front surface of the wiring board WB2. In this case, the semiconductor chip CHP1 and semiconductor chip CHP2 do not configure a package semiconductor device. Therefore, their mounting areas on the wiring board WB1 and wiring board WB2 can be smaller. More specifically, since the planar sizes of the semiconductor chip CHP1 and semiconductor chip CHP2 are far smaller than the planar size of the package semiconductor device, the planar size of the wiring board WB1 or wiring board WB2 can be smaller. This is the first reason that the planar size of the wiring board WB1 or wiring board WB2 can be smaller.

Furthermore, in the first embodiment, the semiconductor chip CHP1 is bare-chip-mounted over the wiring board WB1 and the semiconductor chip CHP2 is bare-chip-mounted over the wiring board WB2, which implies that the semiconductor chip CHP1 is coupled with the wiring board WB1 directly by wires and the semiconductor chip CHP2 is coupled with the wiring board WB2 directly by wires. In other words, unlike the related techniques, no leads exist between the semiconductor chip and wiring board in the first embodiment. This reduces loss in the transmission of an output signal from the semiconductor chip CHP1 to the wiring board WB1 and also reduces loss in the transmission of an output signal from the semiconductor chip CHP2 to the wiring board WB2. Therefore, in the first embodiment, it is less necessary to form an amplifier circuit in the semiconductor chip CHP1 to compensate for attenuation of an output signal from the semiconductor chip CHP1 as in the related techniques. Similarly, it is less necessary to form an amplifier circuit in the semiconductor chip CHP2 to compensate for attenuation of an output signal from the semiconductor chip CHP2. This means that the semiconductor chip CHP1 and semiconductor chip CHP2 can be smaller than in the related techniques. Consequently the mounting area for the semiconductor chip CHP1 and the mounting area for the semiconductor chip CHP2 can be decreased and thus the planar sizes of the wiring board WB1 and wiring board WB2 can be decreased. This is the second reason that the planar size of the wiring board WB1 or wiring board WB2 can be smaller.

Since it is unnecessary to form an additional circuit in the semiconductor chip CHP1 or semiconductor chip CHP2, the overall power consumption of the module is decreased. Particularly this advantageous effect is useful when the module according to the first embodiment is used for a node configuring a wireless sensor network. Specifically the node has a battery or the like for power supply and power is supplied from the battery to the module. Therefore, when the overall power consumption of the module is decreased, the battery life is lengthened and the node can be operated without the need for frequent battery replacement.

As can be understood from the above, the first feature of the first embodiment is that the semiconductor chip CHP1 is bare-chip-mounted over the wiring board WB1 and the semiconductor chip CHP2 is bare-chip-mounted over the wiring board WB2 and this first feature brings about an advantageous effect attributable to the above first and second reasons. Consequently, according to the first embodiment, the planar sizes of the wiring board WB1 and wiring board WB2 can be decreased. Thus, the whole module including the wiring board WB1 and wiring board WB2 can be smaller.

Thus, the whole module according to the first embodiment can be smaller and this advantageous effect is highly useful when the module according to the first embodiment is used for a node configuring a wireless sensor network. This is because the module according to the first embodiment is expected to be mounted, for example, in a set device (external device) and the recent trend is that the compactness of the module is considered as more important than the module cost when it is mounted in the set device. In connection with a node used in a wireless sensor network, there is an increasing tendency that the set device in which the module is mounted becomes smaller and the module must be smaller to match a smaller set device. For the above reason, it is apparent that the module according to the first embodiment which can be small enough is very useful with the spread of the use of a compact node in a wireless sensor network.

Next, a second feature of the first embodiment is that the wireless communication unit and data processing unit of the module are separately mounted. Concretely, the second feature is that the module according to the first embodiment includes the wiring board WB1 and wiring board WB2 which are different from each other and the components mounted over the wiring board WB1 configure the data processing unit and the components mounted over the wiring board WB2 configure the wireless communication unit.

The second feature is concretely explained below. Referring to FIG. 7, the sensor module SM and semiconductor chip CHP1 are mounted over the wiring board WB1. As shown in FIG. 6, the sensor module SM includes a sensor SR such as an acceleration sensor, a sensing unit SU, and an AD conversion unit ADU. As shown in FIG. 3, the sensing unit SU and AD conversion unit ADU configure the analog data processing unit ADPU. On the other hand, as shown in FIG. 6, the semiconductor chip CHP1 includes the numerical analysis unit NAU and judgment unit JU. As shown in FIG. 3, the numerical analysis unit NAU and judgment unit JU configure the digital data processing unit DDPU. Therefore, in the first embodiment, the sensor module SM and semiconductor chip CHP1 which are mounted over the wiring board WB1 make up the digital data processing unit DDPU and analog data processing unit ADPU. This means that in the first embodiment, the components mounted over the wiring board WB1 make up the digital data processing unit DDPU and analog data processing unit ADPU.

On the other hand, referring to FIG. 7, the semiconductor chip CHP2 is mounted over the wiring board WB2. As shown in FIGS. 4 and 5, the oscillator OSR, mixer MIX, and baseband processing unit BBU which configure the wireless communication unit RFU are formed over the semiconductor chip CHP2. Components mounted over the wiring board WB2 configure the balun BL and as shown in FIG. 7, the antenna ANT is mounted over the wiring board WB2. Therefore, it is understood that the components mounted over the wiring board WB2 make up the wireless communication unit RFU and antenna ANT.

It can be understood from the above that in the first embodiment, the data processing unit DPU and wireless communication unit RFU are separately mounted in the module. The advantageous effect of this second feature is explained below. If the wireless communication unit, data processing unit and sensor are integrated into a module as in the related techniques, a radio certification must be acquired according to the sensor type of each module and the module production cost is high.

By contrast, when the wireless communication unit RFU and the data processing unit DPU are separately mounted according to the second feature of the first embodiment, only the data processing unit DPU can be customized while the wireless communication unit RFU which has acquired a radio certification is used as a common unit. Specifically, the wiring board WB2 formed with the wireless communication unit RFU is used as a common unit, so even when the data processing unit DPU is different, it is unnecessary to acquire a wave certification according to the sensor type of each, module and the total module production cost can be reduced. In particular, a module which can cope with a different type sensor can be configured by customizing only the configuration of the wiring board WB1 formed with the data processing unit DPU while using the common wiring board WB2 formed with the wireless communication unit RFU. Therefore, since more common components can be used for a module package, versatility is increased and in this sense as well, module production cost can be reduced. In other words, according to the second feature of the first embodiment, the use of the wireless communication unit RFU as a common unit makes it easier to acquire a radio certification and the use of common components increases versatility, leading to a substantial reduction in module production cost.

A third feature of the first embodiment is that the wiring board WB1 and wiring board WB2 are stacked one upon the other in the board thickness direction to make up a module. Consequently the planar size of the whole module can be smaller. If the wireless communication unit RFU, data processing unit DPU, antenna ANT, and sensor are integrally mounted over a single wiring board, the number of components mounted on the wiring board increases and thus the planar size of the wiring board should be larger and the planar size of the whole module should be larger.

By contrast, when the wiring board WB2 on which the wireless communication unit RFU and antenna ANT are arranged is stacked over the wiring board WB1 on which the sensor and data processing unit DPU are arranged according to the third feature of the first embodiment, the number of components mounted on the wiring board WB1 or wiring board WB2 is smaller. Consequently, the planar sizes of the wiring board WB1 and wiring board WB2 can be smaller. By stacking the wiring board WB2 over the wiring board WB1, the planar size of the whole module is substantially decreased. Thus, according to the first embodiment, the module which includes the wiring board WB1 and wiring board WB2 can be smaller. Also, due to the synergistic effect of the first and third features of the first embodiment, the module according to the first embodiment can be further compact. In addition, according to the third feature of the first embodiment, external coupling terminals to be coupled to a set device have only to be provided on the wiring board WB1 as the lower board. This means that the module according to the first embodiment has only to provide the minimum necessary number of external coupling terminals. As a consequence, the area required for coupling between the module according to the first embodiment and the set device can be decreased. Therefore, the set device's area for coupling with the module can be decreased, so not only the module according to the first embodiment but also the set device can be smaller. Thus, according to the third feature of the first embodiment, since not only the module but also the set device can be smaller, the node which includes the module and set device can be smaller.

A fourth feature of the first embodiment is that the external coupling terminals on the wiring board WB1 are edge terminals EGT as shown in FIG. 7. In this case, the back surface of the wiring board WB1 is flat. Consequently, according to the first embodiment, the module can be joined to the set device in close contact with the device, thereby enhancing the reliability of coupling between the module and set device. Another advantage of the edge terminals EGT is that they can be mounted on the set device by soldering and their coupling can be checked more easily.

A fifth feature of the first embodiment is that the wiring board WB1 and wiring board WB2 are coupled by a connector. In this case, the wiring board WB1 and wiring board WB2 can be detached from each other. This means that if a problem occurs, for example, in the wireless communication unit RFU mounted on the wiring board WB2 as the upper board, the wiring board WB2 can be easily detached from the wiring board WB1. By replacing the defective wiring board WB2 with a good one and coupling it to the wiring board WB1, the module can be used with no problem.

A sixth feature of the first embodiment is that the semiconductor chip CHP1 based on an MCU is mounted over the wiring board WB1 and the semiconductor chip CHP2 based on an MCU is mounted over the wiring board WB2 as shown in FIG. 7. In other words, the sixth feature of the first embodiment is that the module has two different MCUs (twin MCU). In this case, the following advantageous effect is brought about.

In the first embodiment, the MCU-based semiconductor chip CHP1 mounted over the wiring board WB1 has the digital data processing unit DDPU including the numerical analysis unit NAU and judgment unit JU and mainly performs numerical processing. On the other hand, the MCU-based semiconductor chip CHP2 mounted over the wiring board WB2 includes part of the wireless communication unit RFU. Therefore, when the semiconductor chip CHP1 and semiconductor chip CHP2 are arranged as in the first embodiment, it is possible that the semiconductor chip CHP1 performs numerical processing and sends only required data to the semiconductor chip CHP2 and the data is transmitted using the wireless communication function of the semiconductor chip CHP2. Specifically, in the first embodiment, by separating the semiconductor chip CHP1 formed with the digital data processing unit DDPU and the semiconductor chip CHP2 formed with part of the wireless communication unit RFU, only required data can be transmitted to the wireless sensor network. Consequently, the volume of transmitted data can be decreased and the communication traffic in the wireless sensor network can be reduced.

Furthermore, interrupt control is simplified by functional sharing between the MCU (arithmetic operation function) of the semiconductor chip CHP1 and the MCU (communication function) of the semiconductor chip CHP1 2. Consequently, according to the first embodiment, the system implemented by the module can be stabilized.

A seventh feature of the first embodiment is that the formation of a conductor pattern around the antenna ANT is avoided as far as possible. Concretely, the first point is to arrange the connector so as to make the distance between the connector on the back surface of the wiring board WB2 and the antenna ANT on the front surface of the wiring board WB2 as large as possible.

Figure 8:
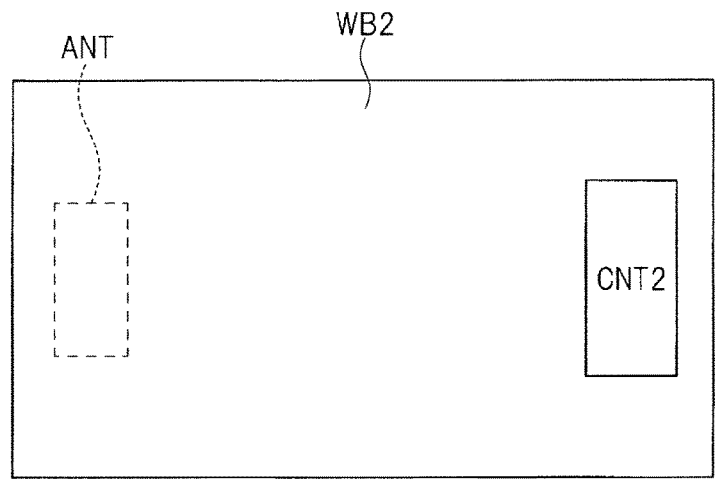
FIG. 8 is a plan view showing the back surface of the wiring board according to the first embodiment.

FIG. 8 is a plan view showing the back surface of the wiring board WB2 in the first embodiment. Referring to FIG. 8, in the plan view, a connector CNT2 for coupling the wiring board WB1 and wiring board WB2 electrically and mechanically is located in a region of the back surface of the wiring board WB2 which overlaps the first region (right region) where the semiconductor chip CHP2 lies. Consequently, the planar distance between the antenna ANT in the second region (left region) of the front surface of the wiring board WB2 and the connector CNT2 is sufficiently large as shown in FIG. 8. This improves the radiation characteristic of the antenna ANT, which lengthens the module communication distance. If there is a conductor pattern around the antenna ANT, the electromagnetic wave shielding effect of the conductor pattern seriously worsens the radiation characteristic of the antenna ANT. For this reason, in the first embodiment, in order not to form a conductor pattern around the antenna ANT, the first point is to make the connector CNT2 of conductor as remote from the antenna ANT as possible. This suppresses the influence of the connector CNT2 on the radiation characteristic of the antenna ANT.

Figure 9:
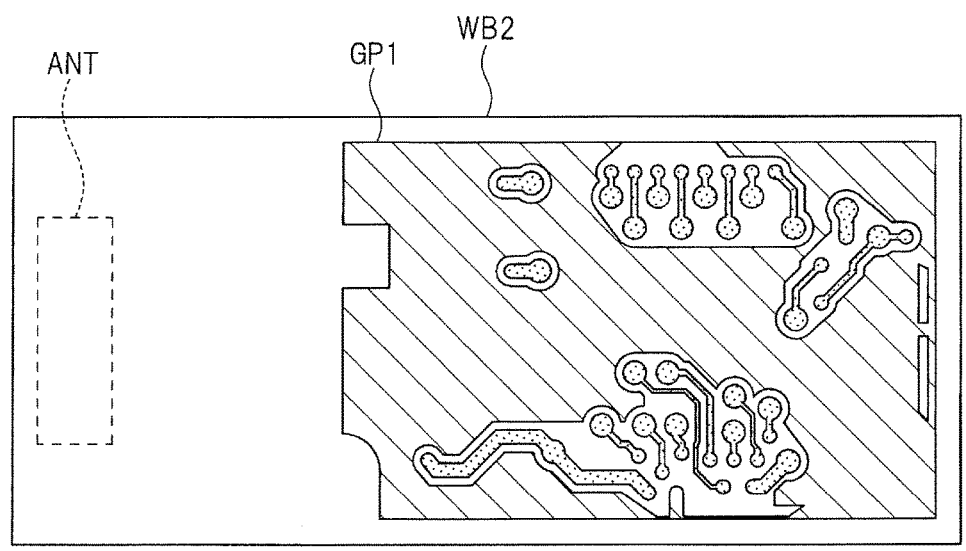
FIG. 9 shows a wiring pattern lying in the layer just below the front surface of the board.
Figure 10:
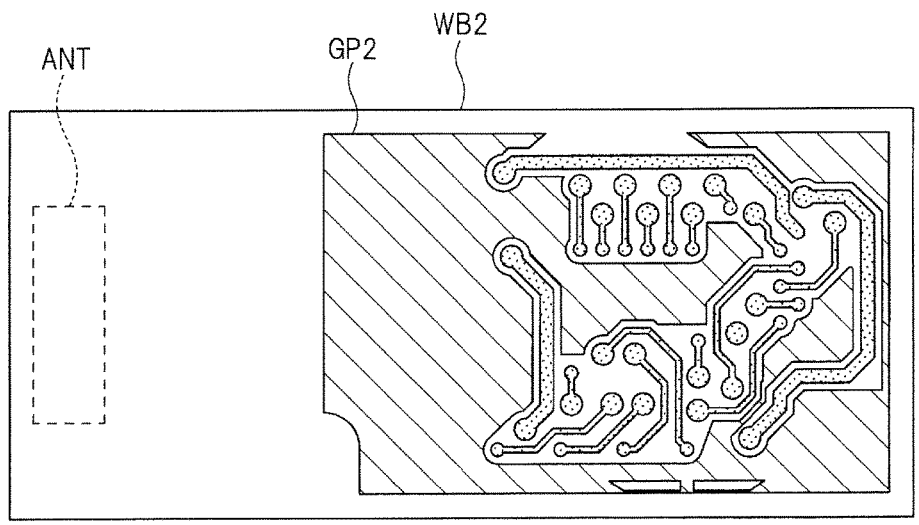
FIG. 10 shows a wiring pattern lying in the second layer below from the front surface.
Figure 11:
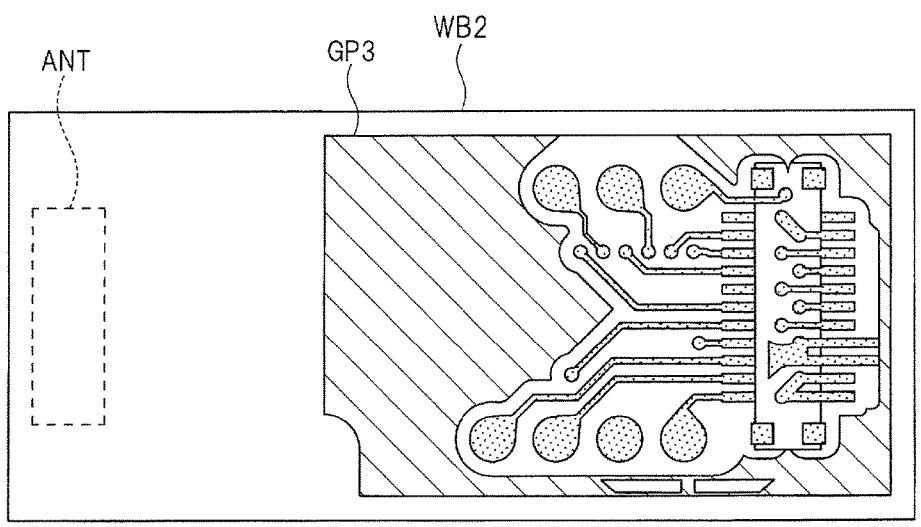
FIG. 11 shows a wiring pattern lying in the third layer below from the front surface.

In the module according to the first embodiment, in order to improve the radiation characteristic of the antenna ANT, the second point is to take the location of the conductor pattern of the wiring board WB2 into consideration. For example, the wiring board WB2 is a multilayer wiring board and FIG. 9 shows a wiring pattern lying in the layer just below the front surface of the board. As shown in FIG. 9, a large ground pattern GP1 supplied with reference voltage is formed in this layer in a way that it does not overlap the antenna ANT in a plan view, as far as possible. FIG. 10 shows a wiring pattern lying in the second layer below from the front surface. As shown in FIG. 10, a ground pattern GP2 supplied with reference voltage is also formed in this layer and the ground pattern GP2 is also located in a way that it does not overlap the antenna ANT in a plan view, as far as possible. Furthermore, FIG. 11 shows a wiring pattern lying in the third layer below from the front surface. As shown in FIG. 11, a ground pattern GP3 supplied with reference voltage is also formed in this layer and the ground pattern GP3 is also located in a way that it does not overlap the antenna ANT in a plan view, as far as possible.

As mentioned above, the wiring board WB2 in the first embodiment is designed so that the ground patterns GP1, GP2, and GP3 lying in the layers inside the wiring board WB2 are not located around the antenna ANT. Thus, according to the first embodiment, the influence of the electromagnetic wave shielding effect of the ground patterns GP1, GP2, and GP3 on the antenna ANT is suppressed. In short, in the first embodiment, special consideration is given to the positions of the ground patterns GP1, GP2, and GP3 to minimize their influence on the radiation characteristic of the antenna ANT.

Thus, in the module according to the first embodiment, even when the antenna ANT is mounted over the wiring board WB2, the synergistic effect of the above first point relating to the position of the connector CNT2 and the second point relating to the positions of the ground patterns GP1, GP2, and GP3 prevents the radiation characteristic of the antenna ANT from worsening. Thus, the module according to the first embodiment lengthens the communication distance of the node. This implies that the range of choice of communication paths in "multi-hop ad hoc communication" in the wireless sensor network is broadened. In other words, when the node communication distance is lengthened, even if a communication path to an adjacent node becomes unusable due to a communication failure, a path for communication with a remote node is available. Therefore, when the module according to the first embodiment is used for a node in a wireless sensor network, the wireless sensor network is less susceptible to communication failures.

<First Variation>

In the first embodiment, as shown in FIG. 7, wires are used for electrical coupling between the wiring board WB1 and semiconductor chip CHP1 and also between the wiring board WB2 and semiconductor chip CHP2. However, the invention is not limited to the above electrical coupling method; for example, flip-chip bonding using bump electrodes may be adopted for electrical coupling between the wiring board WB1 and semiconductor chip CHP1 and between the wiring board WB2 and semiconductor chip CHP2.

<Second Variation>

In the first embodiment, as shown in FIGS. 4 and 5, the balun BL is a component mounted separately from the semiconductor chip CHP2. However, the invention is not limited thereto; for example, the balun BL may be contained in the semiconductor chip CHP2 or if the semiconductor chip CHP2 can be coupled directly with the antenna ANT (antenna circuit), a balun may not be provided.

<Third Variation>

In the first embodiment, as shown in FIG. 7, the antenna ANT is mounted over the front surface of the wiring board WB2. However the invention is not limited thereto and the antenna ANT need not be mounted over the wiring board WB2. For compactness of the module, however, it is desirable that the antenna ANT be mounted over the front surface of the wiring board WB2 formed with the wireless communication unit RFU as in the first embodiment.

<Fourth Variation>

In the first embodiment, as shown in FIG. 7, the sensor module SM is mounted over the front surface of the wiring board WB1. However the invention is not limited thereto and alternatively it is possible that the sensor is located externally and the analog data processing unit ADPU to be electrically coupled with the sensor is located on the wiring board WB1. In this case, the data processing unit DPU on the wiring board WB1 includes the analog data processing unit ADPU and digital data processing unit DDPU.

Alternatively the whole sensor module SM which includes the analog data processing unit ADPU and sensor SR may be located externally. In this case, the data processing unit DPU on the wiring board WB1 is a digital data processing unit DDPU.

<Fifth Variation>

Not only a semiconductor chip in the form of a chip but also a package semiconductor device may be mounted over the wiring board WB1 and wiring board WB2. According to the technical idea of the first embodiment, at least some (not all) of the semiconductor chips mounted over the wiring board WB1 and wiring board WB2 should be mounted in the form of a chip (bare chip mounted) and in that case as well, the whole module including the wiring board WB1 and wiring board WB2 can be small.

<Sixth Variation>

In the first embodiment, the wireless sensor network uses a multi-hop ad hoc communication system as a wireless communication system. However, according to the technical idea of the first embodiment, the invention is not limited thereto; for example, various wireless communication systems including a peer-to-peer communication system may be adopted. An example of a wireless communication system based on peer-to-peer communication is a system in which a wireless communication module (node) processes a signal from a temperature sensor for measuring the body temperature of a person and transmits processed data to the smart phone of the person.

Particularly in a master-slave wireless communication system based on peer-to-peer communication, the terminal (slave) need not always be on and the terminal has only to be started for each event so that power consumption can be reduced.

Second Embodiment

<Node Package Structure in the Second Embodiment>

Figure 12:
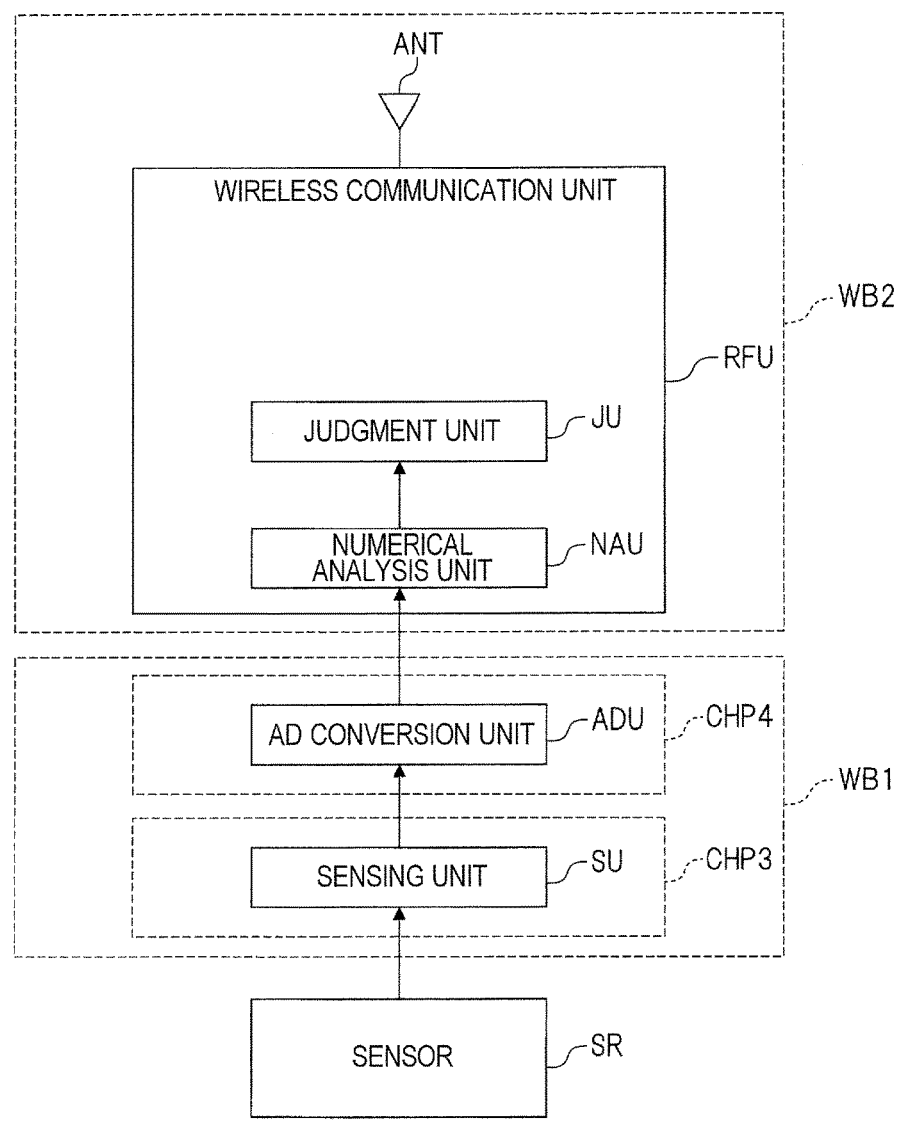
FIG. 12 shows the relation between the node functional components and the wiring boards formed with them in the second embodiment.

The second embodiment concerns a module with enhanced versatility. FIG. 12 shows the relation between the node functional components and the wiring boards formed with them in the second embodiment. Referring to FIG. 12, in the second embodiment, a sensing unit SU is formed on a semiconductor chip CH3 and an AD conversion unit ADU is formed on a semiconductor chip CHP4. The semiconductor chips CHP3 and CHP4 are mounted over a common wiring board WB1. On the other hand, a numerical analysis unit NAU and a judgment unit JU which configure a digital data processing unit are included in a wireless communication unit RFU and the wireless communication unit RFU and an antenna ANT are located on a wiring board WB2, a wiring board other than the wiring board WB1.

Figure 13:
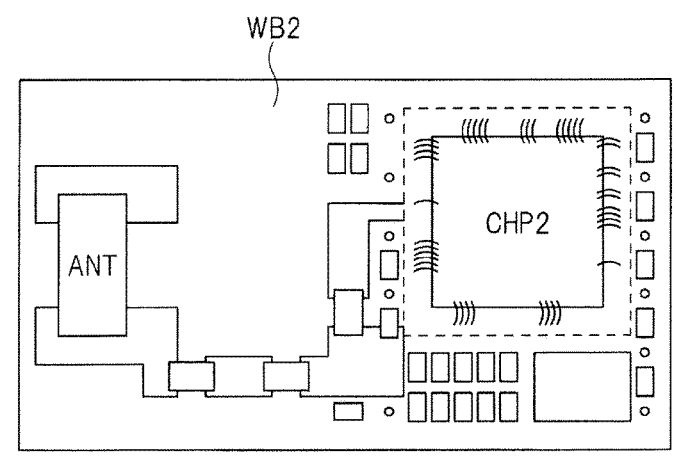
FIG. 13 shows the external structure of the module according to the second embodiment.
Figure 13:
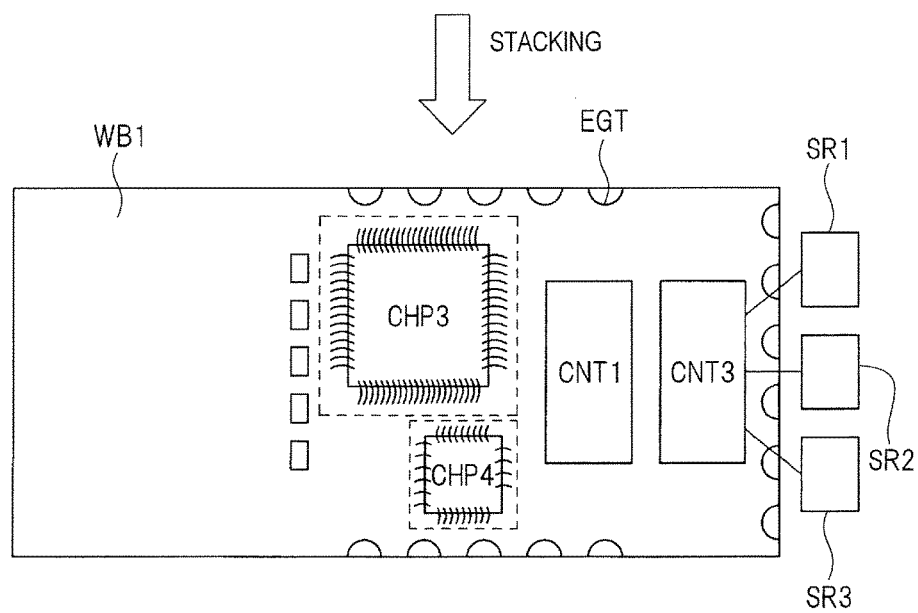

Next, the external structure of the module (electronic device) in the second embodiment which corresponds to the above node package structure will be described. FIG. 13 shows the external structure of the module according to the second embodiment. Referring to FIG. 13, the module according to the second embodiment includes a wiring board WB1 and a wiring board WB2, in which the wiring board WB2 lies over the wiring board WB1.

The semiconductor chips CHP3 and CHP4, a connector CNT1, and a sensor connector CNT3 are mounted over the wiring board WB1 and edge terminals EGT which function as external coupling terminals are formed on the side faces of the wiring board WB1. The semiconductor chips CHP3 and CHP4, connector CNT1 and sensor connector CNT3 are electrically coupled. For example, the sensor connector CNT3 and semiconductor chip CH3 are electrically coupled and the semiconductor chip CHP3 and semiconductor chip CHP4 are electrically coupled.

In the second embodiment, the semiconductor chips CHP3 and CHP4 are mounted over the front surface of the wiring board WB1 in the form of a chip. In other words, in the second embodiment, the semiconductor chips CHP3 and CHP4 are bare-chip-mounted over the wiring board WB1.

The semiconductor chip CHP3 and the wiring board WB1 are electrically coupled, for example, by wires. Specifically, pads (not shown) on the semiconductor chip CHP3 are electrically coupled with terminals (not shown) on the wiring board WB1, for example, by gold wires. In order to protect the wires, the surface of the semiconductor chip CHP3 including the wires is covered by potting resin.

Similarly, the semiconductor chip CHP4 and the wiring board WB1 are electrically coupled by wires. Specifically, pads (not shown) on the semiconductor chip CHP4 are electrically coupled with terminals (not shown) on the wiring board WB1, for example, by gold wires. In order to protect the wires, the surface of the semiconductor chip CHP4 including the wires is covered by potting resin.

On the other hand, a semiconductor chip CHP2 and an antenna ANT are mounted over the wiring board WB2 which is other than the wiring board WB1. The semiconductor chip CHP2 and the antenna ANT are arranged so that the distance between them is as large as possible. For example, as shown in FIG. 13, the semiconductor chip CHP2 is located in a first region as a right region of the wiring board WB2 and the antenna ANT is located in a second region as a left region of the wiring board WB2. The semiconductor chip CHP2 is mounted over the front surface of the wiring board WB2 in the form of a chip. In other words, in the second embodiment as well, the semiconductor chip CHP2 is bare-chip-mounted over the wiring board WB2. The semiconductor chip CHP2 and the wiring board WB2 are electrically coupled, for example, by wires. Specifically, pads (not shown) on the semiconductor chip CHP2 are electrically coupled with terminals (not shown) on the wiring board WB2, for example, by gold wires. In order to protect the wires, the surface of the semiconductor chip including the wires is covered by potting resin. Although not shown in FIG. 13, a connector is located on the back surface of the wiring board WB2 and by coupling the connector on the back surface of the wiring board WB2 with the connector CNT1 on the front surface of the wiring board WB1, the wiring board WB1 and the wiring board WB2 are electrically coupled. In the module according to the second embodiment, the wiring board WB2 lies over the wiring board WB1.

<Feature of the Second Embodiment>

A feature of the second embodiment is that for example, as shown in FIG. 13, the sensor connector CNT3 is mounted over the wiring board WB1 and the wiring board WB1 is electrically coupled with different types of externally located sensors SR1 to SR3 by the sensor connector CNT3. In other words, the major feature of the second embodiment is that the wiring board WB1 is shared by the different types of sensors SR1 to SR3. This enhances the versatility of the module according to the second embodiment.

When the wiring board WB1 and the sensor SR1 are coupled through the sensor connector CNT3 on the wiring board WB1, the sensing unit SU on the semiconductor chip CHP3 and the AD conversion unit ADU on the semiconductor chip CHP4 can be customized for the sensor SR1.

Concretely, the function to amplify an output signal from the sensor SR1, the function to remove noise from the output signal, if the output signal is a current signal, the function to convert it into a voltage signal, and the function to convert an analog signal into a digital signal can be customized for the sensor SR1. Similarly, when the wiring board WB1 and the sensor SR2 or SR3 are coupled through the sensor connector CNT3 on the wiring board WB1, the sensing unit SU on the semiconductor chip CHP3 and the AD conversion unit ADU on the semiconductor chip CHP4 can be customized for the sensor SR2 or SR3.

Thus, according to the second embodiment, since the versatility of the module is enhance, a wider range of sensor types are applicable to the module and the move towards a common module which can cope with different types of sensors is stimulated, leading to reduction in module production cost. In other words, in the second embodiment, a module which can cope with different types of sensors can be implemented only by customizing the functions of the semiconductor chips CHP3 and CHP4 mounted over the wiring board WB1 without the need for altering the package structure of the wiring board WB2 in which the wireless communication unit RFU is arranged and the package structure of the wiring board WB1 in which the data processing unit DPU is arranged. Therefore, versatility can be enhanced by using many more common module components and module production cost can be reduced.

<Variation>

In the second embodiment, the digital data processing unit DDPU including the numerical analysis unit NAU and judgment unit JU is formed on the semiconductor chip CHP2 mounted over the wiring board WB2. However the invention is not limited thereto; for example, a semiconductor chip formed with the digital data processing unit DDPU may be mounted over the wiring board WB1.

Third Embodiment

Figure 14:
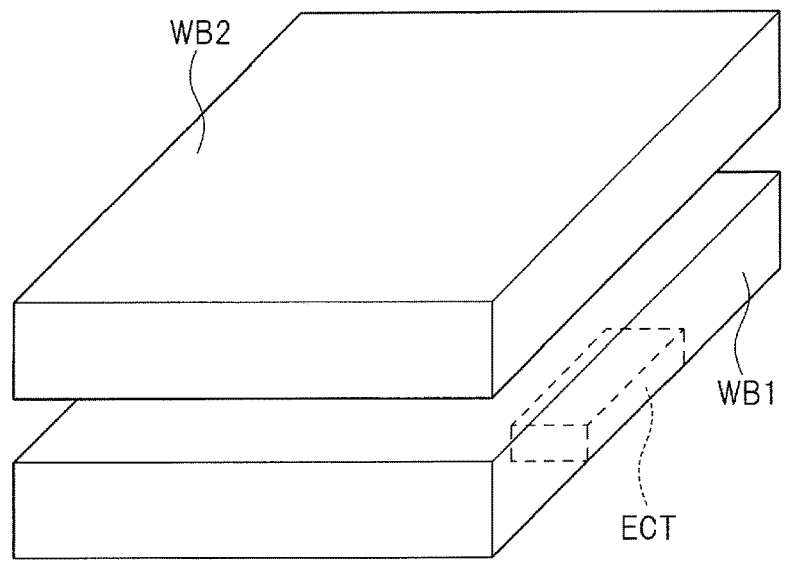
FIG. 14 is a schematic view showing an example of the positional relation between the two wiring boards of the module according to a third embodiment.

The third embodiment focuses on the positional relation between the wiring board WB1 and wiring board WB2 of the module. FIG. 14 is a schematic view showing an example of the positional relation between the wiring board WB1 and wiring board WB2. As shown in FIG. 14, in the module according to the third embodiment, the wiring board WB2 on which the wireless communication unit is arranged lies over the wiring board WB1 on which the data processing unit is arranged. In the module according to the third embodiment, the wiring board WB1 and wiring board WB2 are stacked in the thickness direction and the wiring board WB1 is located on the wiring board WB2's back side opposite to its front surface side. For example, an external coupling terminals ECT is formed on the back surface of the wiring board WB1.

In the module thus configured according to the third embodiment, since the wiring board WB1 and wiring board WB2 are stacked, the bottom area of the module can be small. According to the third embodiment, the limit on the heights of components mounted on the overlying wiring board WB2 can be eased.

<First Variation>

Figure 15:
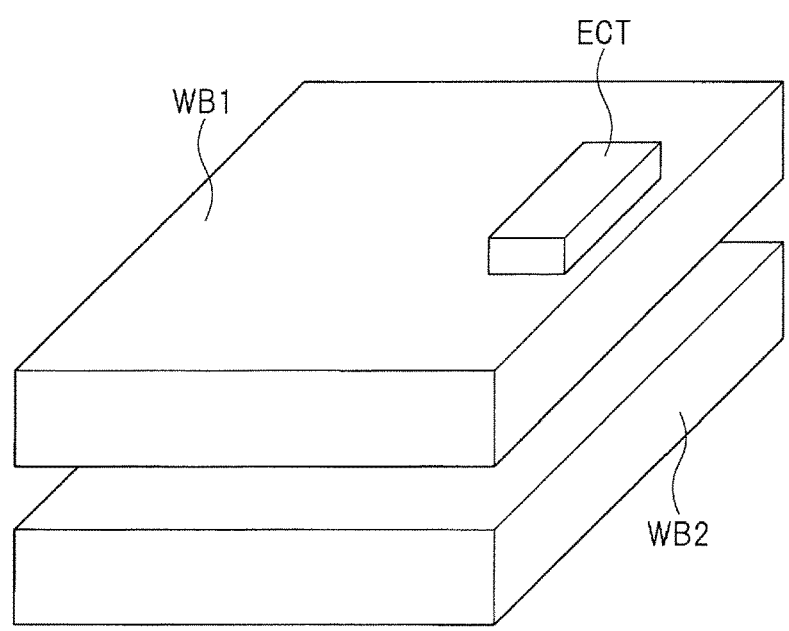
FIG. 15 is a schematic view showing an example of the positional relation between the two wiring boards of the module according to the first variation of the third embodiment.

FIG. 15 is a schematic view showing an example of the positional relation between the wiring board WB1 and wiring board WB2 of the module according to the first variation of the third embodiment. As shown in FIG. 15, in the module according to the first variation, the wiring board WB1 on which the data processing unit is arranged lies over the wiring board WB2 on which the wireless communication unit RFU is arranged. In other words, in the module according to the first variation, the wiring board WB1 and wiring board WB2 are stacked in the thickness direction and the wiring board WB1 is located on the wiring board WB2's front surface side. For example, an external coupling terminal ECT is formed on the front surface of the wiring board WB1.

In the module thus configured according to the first variation, since the wiring board WB1 and wiring board WB2 are stacked, the bottom area of the module can be small. According to the first variation, the limit on the heights of components mounted on the overlying wiring board WB1 can be eased.

<Second Variation>

Figure 16:
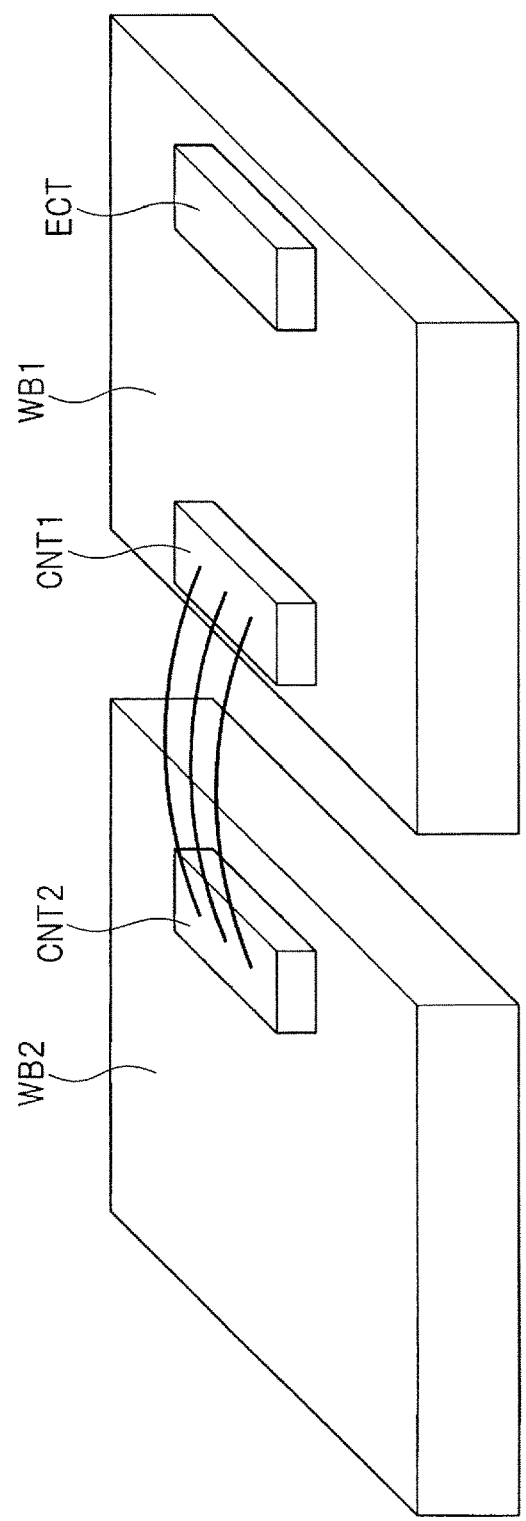
FIG. 16 is a schematic view showing an example of the positional relation between the two wiring boards of the module according to the second variation of the third embodiment.

FIG. 16 is a schematic view showing an example of the positional relation between the wiring board WB1 and wiring board WB2 of the module according to the second variation of the third embodiment. As shown in FIG. 16, in the module according to the second variation, the wiring board WB1 on which the data processing unit is arranged and the wiring board WB2 on which the wireless communication unit is arranged are horizontally arranged side by side. A connector CNT1 is located on the front surface of the wiring board WB1 and a connector CNT2 is located on the front surface of the wiring board WB2. The connectors CNT1 and CNT2 are electrically coupled. Also, an external coupling terminal ECT is located on the front surface of the wiring board WB1.

In the module thus configured according to the second variation, the limit on the heights of the components mounted on the wiring board WB1 can be eased and the limit on the heights of the components mounted on the wiring board WB2 can also be eased. In addition, when an antenna is also mounted over the wiring board WB2 formed with the wireless communication unit, the design freedom of the antenna is increased.

Fourth Embodiment

Figure 17:
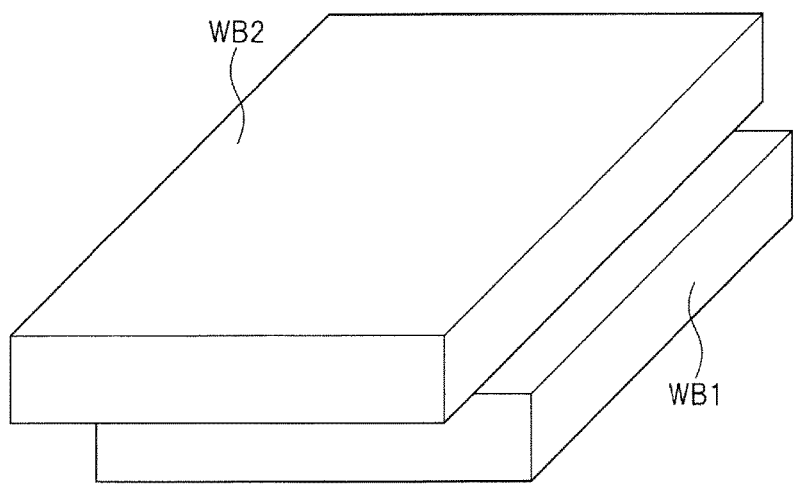
FIG. 17 is a schematic view showing an example of the module configuration according to a fourth embodiment.

The fourth embodiment focuses on a structure with the wiring board WB2 lying over the wiring board WB1 in which the planar size of the wiring board WB1 is different from the planar size of the wiring board WB2. FIG. 17 is a schematic view showing an example of the module according to the fourth embodiment. Referring to FIG. 17, the wiring board WB2 lies over the wiring board WB1 and the planar size of the overlying wiring board WB2 is larger than the planar size of the underlying wiring board WB1. In short, the area of the wiring board WB2 is larger than the area of the wiring board WB1 in a plan view. In this structure, when an antenna is mounted over the overlying wiring board WB2, preferably the antenna mounted over the wiring board WB2 is located in a way not to overlap the wiring board WB1 in a plan view. If so, the radiation characteristic of the antenna is improved, thereby leading to improvement in the communication performance of the module according to the fourth embodiment.

<Variation>

Figure 18:
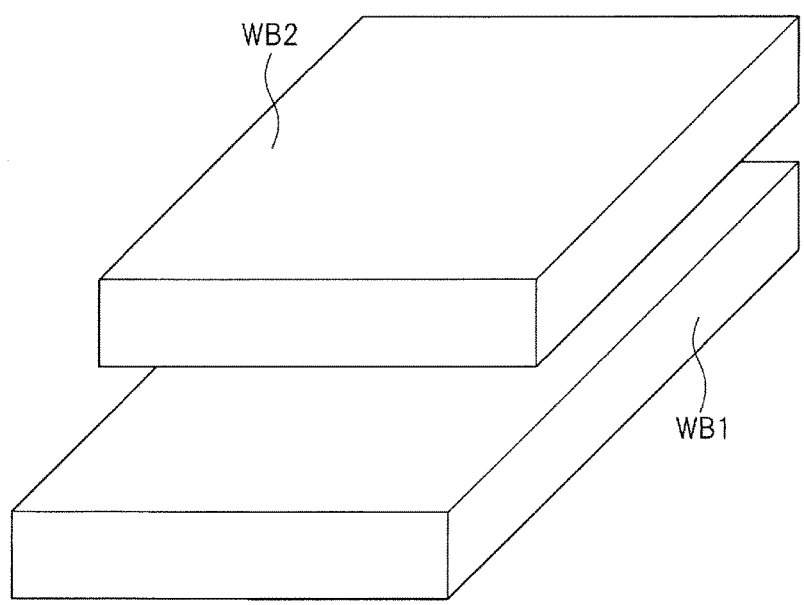
FIG. 18 is a schematic view showing an example of the module configuration according to a variation of the fourth embodiment.

FIG. 18 is a schematic view showing an example of the module according to the variation of the fourth embodiment. Referring to FIG. 18, the wiring board WB2 lies over the wiring board WB1 and the planar size of the overlying wiring board WB2 is smaller than the planar size of the underlying wiring board WB1. In short, the area of the wiring board WB2 is smaller than the area of the wiring board WB1 in a plan view. This structure brings about an advantageous effect that a component with a large height can be mounted in a region of the front surface of the wiring board WB1 which does not overlap the wiring board WB2 in a plan view.

Fifth Embodiment

The fifth embodiment focuses on how the wiring board WB1 and wiring board WB2 are coupled when the wiring board WB2 lies over the wiring board WB1.

Figure 19:
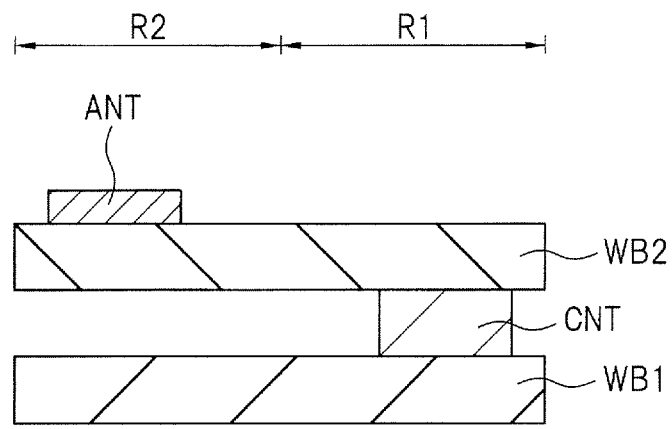
FIG. 19 is a schematic view showing an example of the two wiring boards coupled according to a fifth embodiment.

FIG. 19 is a schematic view showing an example of the wiring board WB1 and wiring board WB2 which are coupled according to the fifth embodiment. Referring to FIG. 19, the wiring board WB1 and wiring board WB2 are coupled electrically and mechanically, for example, by a connector CNT. Specifically, the connector CNT for coupling the wiring board WB1 and wiring board WB2 electrically and mechanically is located in a first region R1. This means that the wiring board WB1 and wiring board WB2 can be coupled and decoupled.

As shown in FIG. 19, an antenna ANT is located in a second region other than the first region R1 of the wiring board WB2. Consequently the planar distance between the antenna ANT in the second region R2 of the wiring board WB2 and the connector CNT in the first region R1 is sufficient. Consequently the wiring board WB1 and wiring board WB2 can be coupled by the connector CNT while the radiation characteristic of the antenna ANT is improved.

<First Variation>

Figure 20:
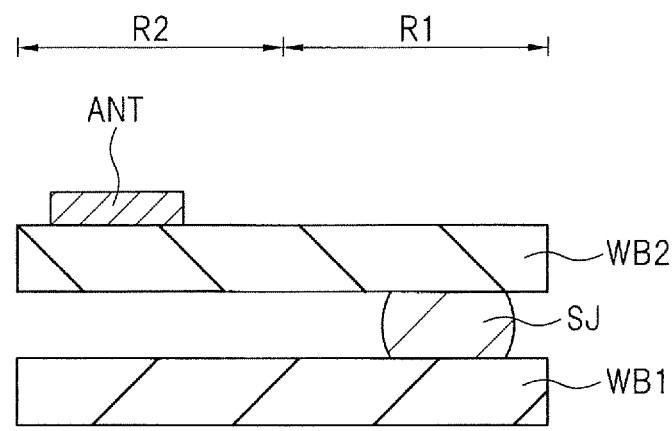
FIG. 20 is a schematic view showing an example of the two wiring boards coupled according to the first variation of the fifth embodiment.

FIG. 20 is a schematic view showing an example of the wiring board WB1 and wiring board WB2 coupled according to the first variation of the fifth embodiment. Referring to FIG. 20, the wiring board WB1 and wiring board WB2 are coupled electrically and mechanically, for example, by a solder joint SJ. In this case, the wiring board WB1 and wiring board WB2 can be designed to cope with a narrow pitch.

As shown in FIG. 20, an antenna ANT is located in a second region other than the first region R1 of the wiring board WB2. Consequently the planar distance between the antenna ANT in the second region R2 of the wiring board WB2 and the solder joint SJ in the first region R1 is sufficient. Consequently the wiring board WB1 and wiring board WB2 can be coupled by the solder joint SJ while the radiation characteristic of the antenna ANT is improved.

<Second Variation>

Figure 21:
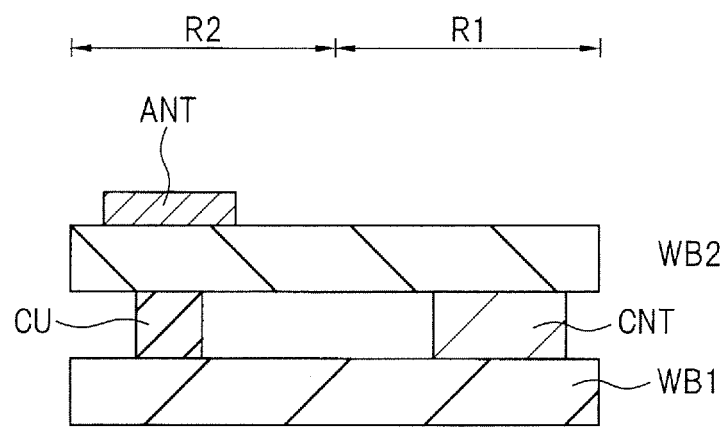
FIG. 21 is a schematic view showing an example of the two wiring boards coupled according to the second variation of the fifth embodiment.

FIG. 21 is a schematic view showing an example of the wiring board WB1 and wiring board WB2 which are coupled according to the second variation of the fifth embodiment. Referring to FIG. 21, the wiring board WB1 and wiring board WB2 are coupled electrically and mechanically, for example, by a connector CNT. Specifically, the connector CNT for coupling the wiring board WB1 and wiring board WB2 electrically and mechanically is located in the first region R1. In addition, in the second variation, a coupling unit CU for coupling the wiring board WB1 and wiring board WB2 mechanically is located in the second region R2. Since the coupling unit CU is, for example, an insulating member, it does not unfavorably influence the radiation characteristic of the antenna ANT in the second region R2. This means that according to the second variation, the wiring board WB1 and wiring board WB2 are coupled by the connector CNT in the first region R1 and the coupling unit CU in the second region R2 without deterioration in the radiation characteristic of the antenna ANT. Consequently, according to the second variation, the strength of coupling between the wiring board WB1 and wiring board WB2 is increased without affecting the radiation characteristic of the antenna ANT.

<Third Variation>

Figure 22:
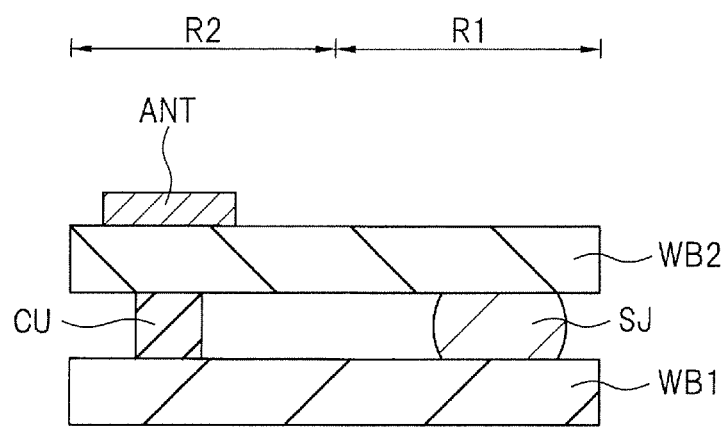
FIG. 22 is a schematic view showing an example of the two wiring boards coupled according to the third variation of the fifth embodiment.

FIG. 22 is a schematic view showing an example of the wiring board WB1 and wiring board WB2 coupled according to the third variation of the fifth embodiment. Referring to FIG. 22, the wiring board WB1 and wiring board WB2 are coupled electrically and mechanically, for example, by a solder joint SJ. In addition, in the third variation, a coupling unit CU for coupling the wiring board WB1 and wiring board WB2 mechanically is located in the second region R2. Since the coupling unit CU is made of, for example, insulating material, it does not unfavorably influence the radiation characteristic of the antenna ANT in the second region R2. This means that according to the third variation, the wiring board WB1 and wiring board WB2 are coupled by the solder joint SJ in the first region R1 and the coupling unit CU in the second region R2 without deterioration in the radiation characteristic of the antenna ANT. Consequently, according to the third variation, the strength of coupling between the wiring board WB1 and wiring board WB2 is increased without affecting the radiation characteristic of the antenna ANT.

Sixth Embodiment

The sixth embodiment focuses on an external coupling terminal ECT on the wiring board WB1 in a structure with the wiring board WB2 lying over the wiring board WB1.

Figure 23:
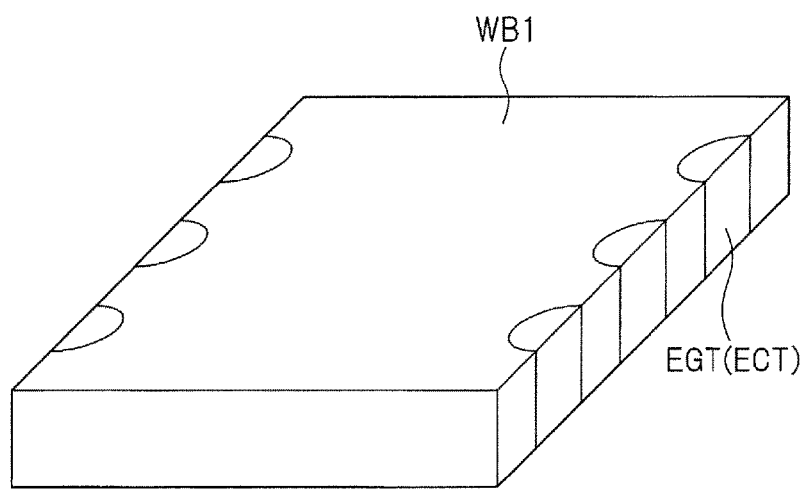
FIG. 23 is a schematic view showing an example of an external coupling terminal on a wiring board according to a sixth embodiment.

FIG. 23 is a schematic view showing an example of external coupling terminals ECT on the wiring board WB1 according to the sixth embodiment. As shown in FIG. 23, in the sixth embodiment, the external coupling terminals ECT on the wiring board WB1 may be edge terminals EGT formed on the side faces of the wiring board WB1. This brings about the following advantageous effects: (1) the back surface of the wiring board WB1 is flat; (2) the board can be mounted on a set device by soldering; and (3) the coupling can be checked easily.

<First Variation>

Figure 24:
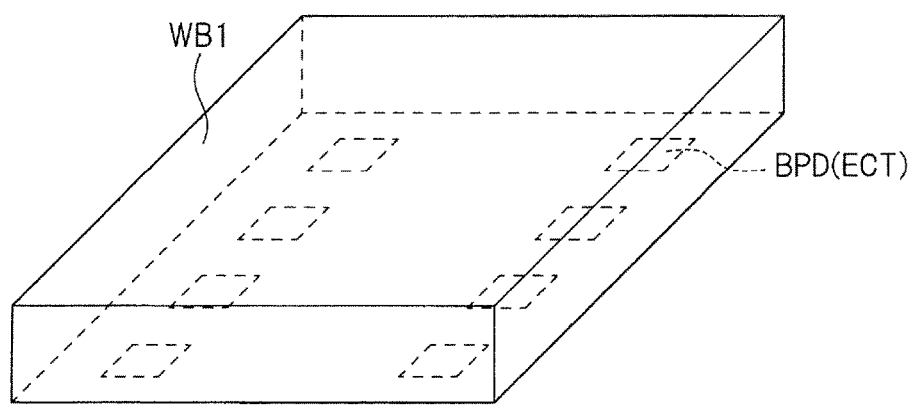
FIG. 24 is a schematic view showing an example of an external coupling terminal on a wiring board according to the first variation of the sixth embodiment.

FIG. 24 is a schematic view showing an example of external coupling terminals ECT on the wiring board WB1 according to the first variation of the sixth embodiment. As shown in FIG. 24, in the first variation, the external coupling terminals ECT on the wiring board WB1 may be back pads BPD formed on the back surface of the wiring board WB1. This brings about the following advantageous effects: (1) the back surface of the wiring board WB1 is flat; and (2) the board can be mounted on a set device by soldering.

<Second Variation>

Figure 25:
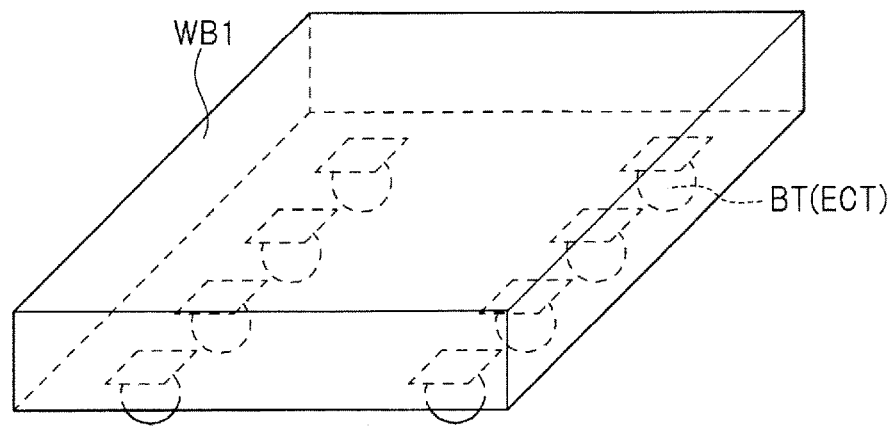
FIG. 25 is a schematic view showing an example of an external coupling terminal on a wiring board according to the second variation of the sixth embodiment.

FIG. 25 is a schematic view showing an example of external coupling terminals ECT on the wiring board WB1 according to the second variation of the sixth embodiment. As shown in FIG. 25, in the second variation, the external coupling terminals ECT on the wiring board WB1 may be ball terminals BT formed on the back surface of the wiring board WB1. This brings about the advantageous effect that the board can be mounted on a set device by soldering.

<Third Variation>

Figure 26:
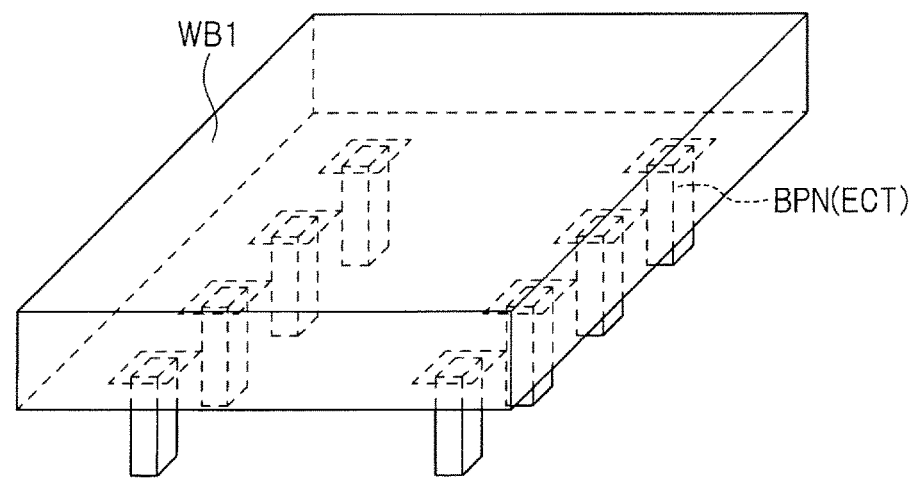
FIG. 26 is a schematic view showing an example of an external coupling terminal on a wiring board according to the third variation of the sixth embodiment.

FIG. 26 is a schematic view showing an example of external coupling terminals ECT on the wiring board WB1 according to the third variation of the sixth embodiment. As shown in FIG. 26, in the third variation, the external coupling terminals ECT on the wiring board WB1 may be back pins BPN formed on the back surface of the wiring board WB1. This brings about the following advantageous effects: (1) the board can be mounted on a set device by soldering; and (2) the coupling can be checked easily.

<Fourth Variation>

Figure 27:
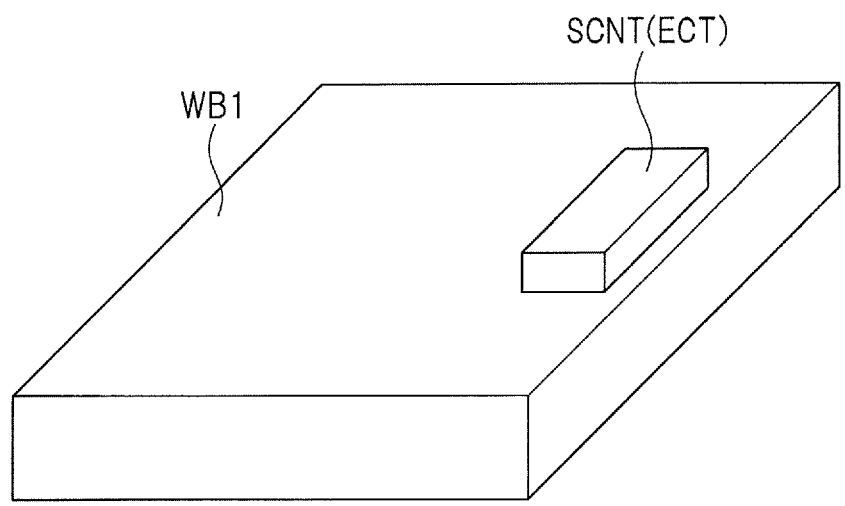
FIG. 27 is a schematic view showing an example of an external coupling terminal on a wiring board according to the fourth variation of the sixth embodiment.

FIG. 27 is a schematic view showing an example of an external coupling terminal ECT on the wiring board WB1 according to the fourth variation of the sixth embodiment. As shown in FIG. 27, in the fourth variation, the external coupling terminal ECT on the wiring board WB1 may be a surface connector SCNT formed on the front surface of the wiring board WB1. This brings about the following advantageous effects: (1) the back surface of the wiring board WB1 is flat; and (2) the coupling can be checked easily.

<Fifth Variation>

Figure 28:
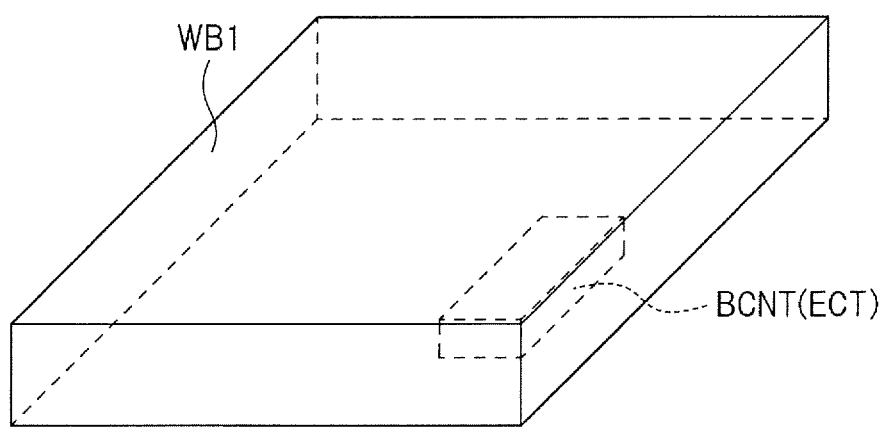
FIG. 28 is a schematic view showing an example of an external coupling terminal on a wiring board according to the fifth variation of the sixth embodiment.

FIG. 28 is a schematic view showing an example of an external coupling terminal ECT on the wiring board WB1 according to the fifth variation of the sixth embodiment. As shown in FIG. 28, in the fifth variation, the external coupling terminal ECT on the wiring board WB1 may be a back connector BCNT formed on the back surface of the wiring board WB1.

Seventh Embodiment

The seventh embodiment focuses on a module as a relay node in which a wireless sensor network includes, as the constituent elements thereof, not only a plurality of nodes with a function to process an output signal from a sensor and transmit it but also a relay node with a special function to relay communication between nodes.

Figure 29:
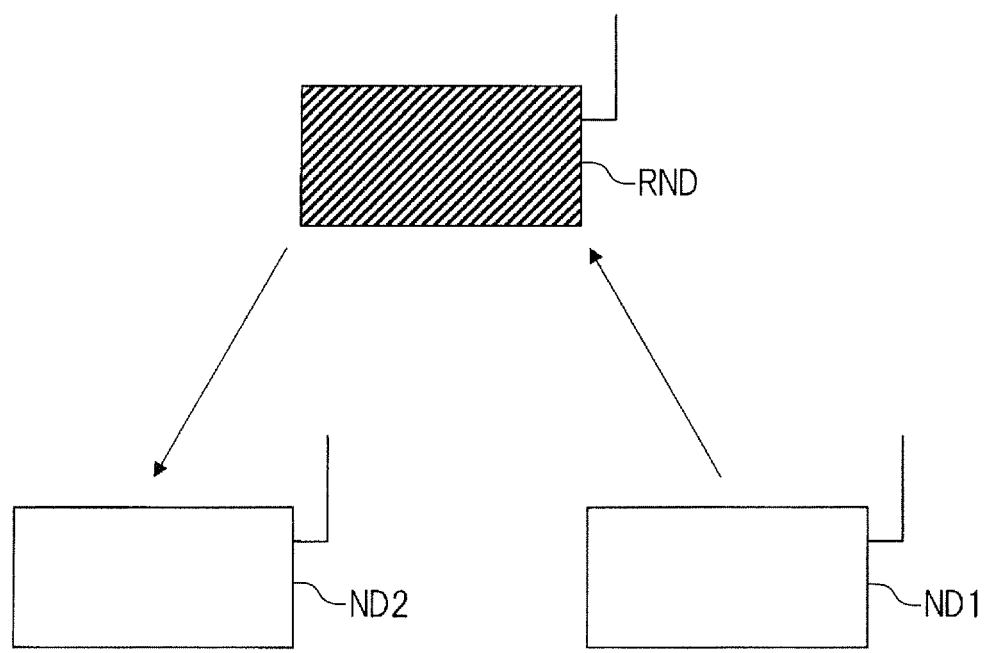
FIG. 29 shows nodes and a relay node which configure a wireless sensor network.

FIG. 29 shows a node ND1, node ND2, and relay node RND as constituent elements of a wireless sensor network.

For example, the, wireless sensor network uses a "multi-hop ad hoc communication" system in which data received by a node is transmitted between nodes in a bucket-brigade manner. Referring to FIG. 29, "multi-hop ad hoc communication" may be performed in the nodes ND1 and ND2. However, if the distance between the nodes ND1 and ND2 is larger than the communicable distance, "multi-hop ad hoc communication" between the nodes ND1 and ND2 may be impossible in some circumstances.

One possible solution to this is to add a relay node RND as a constituent element of the wireless sensor network. In that case, even when the distance between the nodes ND1 and ND2 is larger than the communicable distance, if the relay node RND is within the communicable distance, "multi-hop ad hoc communication" can be performed through the relay node. Specifically, referring to FIG. 29, after the relay node RND receives a signal from the node ND1, the relay node RND transmits the signal to the node ND2 so that communication is performed between the nodes ND1 and ND2 though the distance between them is larger than the communicable distance. Consequently, in the wireless sensor network including the relay node RND, high network reliability is ensured.

Furthermore, even when the distance between the nodes ND1 and ND2 is within the communicable distance range, due to the presence of the relay node RND, a communication path from the node ND1 to the relay node RND is available in addition to the path from the node ND1 to the node ND2. This offers an advantage that the freedom of choice in "multi-hop ad hoc communication" is increased.

The relay node RND need not have a function to process a signal from the sensor and transmit it, but has only to provide a function to relay communication between nodes. This implies that the module which can be used as the relay node RND may be a module according to the first or second embodiment as mentioned above. Specifically the module according to the first embodiment shown in FIG. 7 and the module according to the second embodiment shown in FIG. 13 may be suitable for use as the relay node RND, in which the semiconductor chip CHP2 and antenna ANT are mounted over the wiring board WB2.

Figure 30:
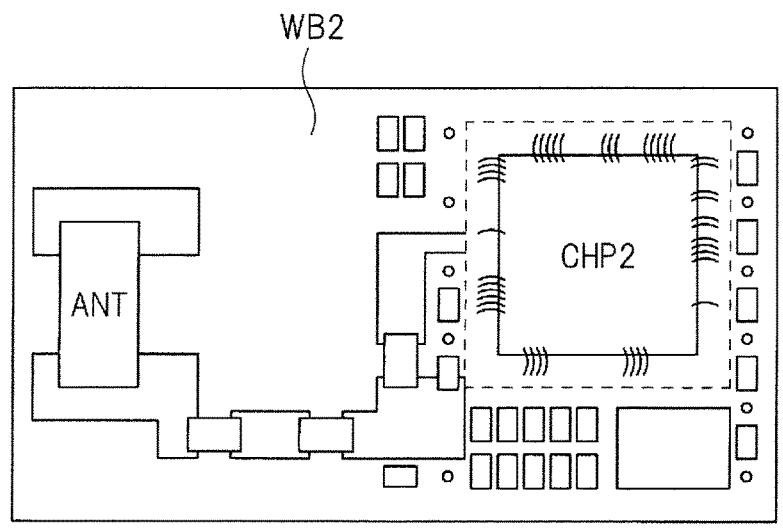
FIG. 30 shows the external structure of the module according to a seventh embodiment.
Figure 31:
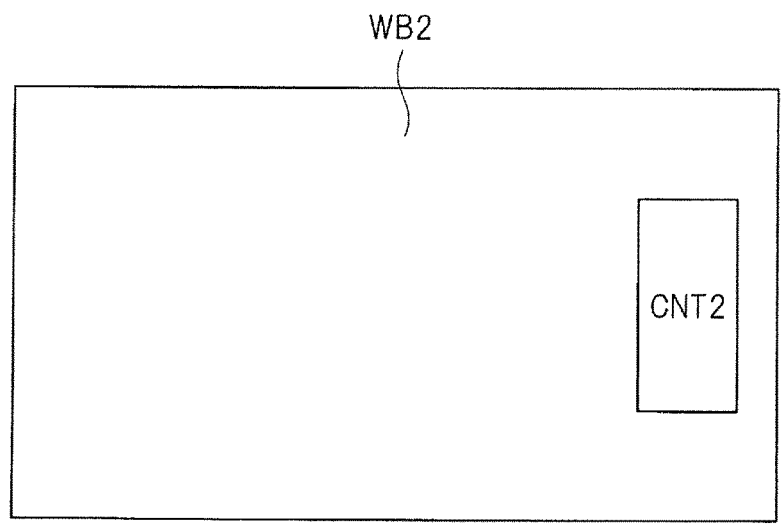
FIG. 31 shows the back surface of the module according to the seventh embodiment.

FIG. 30 shows the external structure of the module according to the seventh embodiment. Referring to FIG. 30, the module according to the seventh embodiment includes a wiring board WB2 on which a semiconductor chip CHP2 and an antenna ANT are arranged. As shown in FIG. 31, a connector CNT2 is located on the back surface of the wiring board WB2. In the module according to the seventh embodiment, the connector CNT 2 functions, for example, as an external coupling terminal used for coupling with a set device.

Alternatively, instead of the connector CNT2, the module according to the seventh embodiment may use, as an external coupling terminal, an edge terminal on an end face of the wiring board WB2, a back pad on the back surface of the wiring board WB2, a ball terminal on the back surface, or a back pin on the back surface.

In the module thus configured according to the seventh embodiment, many elements may be the same as in the module according to the first embodiment and the module according to the second embodiment. Specifically, the wiring board WB2 on which the semiconductor chip CHP2 and antenna ANT are arranged can be used as a common component for the module according to the first embodiment and the module according to the second embodiment as a node in the wireless sensor network and also it can be used for the module according to the seventh embodiment which is used as the relay node RND. Therefore, the wiring board WB2 on which the semiconductor chip CHP2 and antenna ANT are arranged is considered as a highly versatile common component.

The invention made by the present inventors has been so far explained concretely in reference to the preferred embodiments thereof. However, the invention is not limited thereto and it is obvious that these details may be modified in various ways without departing from the spirit and scope thereof.

The foregoing embodiments include the following forms.

Appendix 1

An electronic device in a wireless communication system comprising:

a plurality of nodes having a function to process and transmit a signal from a sensor;

a relay node having a special function to relay communication between the nodes, the device being a constituent element of the relay node, further comprising a wireless communication unit for transmission/reception between the nodes, wherein the wireless communication unit includes a semiconductor chip mounted over a wiring board surface in the form of a chip, and wherein an external coupling terminal for electrical coupling with an external device is located on the wiring board.

Appendix 2

The electronic device described in Appendix 1, further comprising:

an antenna mounted over the surface of the wiring board and electrically coupled with the semiconductor chip.

Appendix 3

The electronic device described in Appendix 1, the external coupling terminal being any one of:

an edge terminal formed on a side face of the wiring board;

a back pad formed on aback surface opposite to the surface of the wiring board;

a ball terminal formed on the back surface;

a back pin formed on the back surface; and a back connector located on the back surface.

Appendix 4

The electronic device described in Appendix 1, wherein the relay node is a constituent element in multi-hop ad hoc communication.

What is claimed is:

1. An electronic device as a constituent element of a wireless communication system, comprising:
 a data processing unit for processing a signal from a sensor; and
 a wireless communication unit for transmitting data processed by the data processing unit,
 wherein the data processing unit includes a first semiconductor chip mounted over a first surface of a first wiring board in the form of a chip,
 wherein the wireless communication unit includes a second semiconductor chip mounted over a second surface of a second wiring board in the form of a chip and the second wiring board overlapping with the first wiring board,
 wherein the first wiring board and the second wiring board are stacked in a thickness direction and electrically coupled by a conductor,
 wherein an external coupling terminal for electrical coupling with an external device is provided in the first wiring board, and
 wherein an antenna mounted over the second wiring board not overlapping with the first wiring board in a plan view.

2. The electronic device according to claim 1, wherein the antenna mounted over the second surface of the second wiring board is electrically coupled with the second semiconductor chip.

3. The electronic device according to claim 2,
 wherein the second semiconductor chip is located in a first region of the second surface of the second wiring board, and
 wherein the antenna is located in a second region of the second surface of the second wiring board which is other than the first region.

4. The electronic device according to claim 3,
 wherein the first wiring board is located on a second back surface side of the second wiring board which is opposite to the second surface.

5. The electronic device according to claim 4, wherein a first coupling part for coupling the first wiring board and the second wiring board electrically and mechanically is located in a region of the second back surface of the second wiring board which overlaps the first region in a plan view.

6. The electronic device according to claim 5, wherein the first coupling part is a connector.

7. The electronic device according to claim 5, wherein the first coupling part is a solder joint.

8. The electronic device according to claim 4, wherein a second coupling part for coupling the first wiring board and the second wiring board mechanically is located in a region of the second back surface of the second wiring board which overlaps the second region in a plan view.

9. The electronic device according to claim 8, wherein the second coupling part is an insulating member.

10. The electronic device according to claim 4,
 wherein an area of the second wiring board is larger than an area of the first wiring board in a plan view, and
 wherein the antenna mounted over the second wiring board is located in a region which does not overlap the first wiring board in a plan view.

11. The electronic device according to claim 4, wherein the area of the second wiring board is smaller than the area of the first wiring board in a plan view.

12. The electronic device according to claim 3, wherein a ground pattern supplied with reference voltage is located in a region inside the second wiring board which overlaps the first region in a plan view.

13. The electronic device according to claim 1,
 wherein the first wiring board is located on the second surface side of the second wiring board.

14. The electronic device according to claim 1,
 wherein the first wiring board is located on a second back surface side of the second wiring board which is opposite to the second surface.

15. The electronic device according to claim 14,
 the external coupling terminal being any one of:
 an edge terminal formed over a side face of the first wiring board;
 a back pad formed over a first back surface opposite to the first surface of the first wiring board;
 a ball terminal formed over the first back surface;
 a back pin formed over the first back surface;
 a front connector located over the first surface; and
 a back connector located over the first back surface.

16. The electronic device according to claim 1, wherein the data processing unit includes at least either an analog data processing unit for processing analog data from the sensor and converting the processed analog data into digital data or a digital data processing unit for processing digital data from the analog data processing unit.

17. The electronic device according to claim 16,
 wherein a sensor including the analog data processing unit is further mounted over the first wiring board, and
 wherein the first semiconductor chip includes the digital data processing unit.

18. The electronic device according to claim 16,
 the first wiring board including:
 a sensor coupling terminal coupled with the sensor;
 the first semiconductor chip electrically coupled with the sensor coupling terminal; and
 a third semiconductor chip electrically coupled with the first semiconductor chip,
 wherein the first semiconductor chip includes a first processing unit for processing analog data sent from the sensor through the sensor coupling terminal as part of the analog data processing unit, and
 wherein the third semiconductor chip includes a second processing unit for processing analog data processed by the first processing unit into digital data as part of the analog data processing unit.

19. The electronic device according to claim 18, wherein the second semiconductor chip includes the digital data processing unit.

20. The electronic device according to claim 1,
 wherein a sensor coupling terminal capable of coupling with the sensor of a different type is located over the first wiring board,
 wherein among functions performed by the data processing unit, at least a function performed by the first semiconductor chip electrically coupled with the sensor through the sensor coupling terminal can be customized according to a type of the coupled sensor, and
 wherein the wireless communication unit including the second semiconductor chip is common among the electronic devices which cope with the sensors of different types.

21. The electronic device according to claim 1, wherein the first semiconductor chip is bare-chip-mounted over the first surface of the first wiring board in the form of a chip.

22. The electronic device according to claim 1, wherein the second semiconductor chip is bare-chip-mounted over the second surface of the second wiring board in the form of a chip.

23. The electronic device according to claim 1, wherein the first wiring board and the second wiring board are detachably mounted to each other.

\* \* \* \* \*